United States Patent
Ishii et al.

(10) Patent No.: US 9,253,879 B2
(45) Date of Patent: Feb. 2, 2016

(54) WIRED CIRCUIT BOARD AND PRODUCING METHOD THEREOF

(71) Applicant: NITTO DENKO CORPORATION, Osaka (JP)

(72) Inventors: Jun Ishii, Osaka (JP); Saori Kanazaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 202 days.

(21) Appl. No.: 13/875,896

(22) Filed: May 2, 2013

(65) Prior Publication Data

US 2013/0319743 A1 Dec. 5, 2013

Related U.S. Application Data

(60) Provisional application No. 61/689,744, filed on Jun. 12, 2012.

(30) Foreign Application Priority Data

May 30, 2012 (JP) .................................. 2012122685

(51) Int. Cl.
| H05K 1/09 | (2006.01) |
| H05K 1/02 | (2006.01) |
| H05K 3/06 | (2006.01) |
| G11B 5/48 | (2006.01) |
| H05K 3/40 | (2006.01) |

(Continued)

(52) U.S. Cl.
CPC .............. *H05K 1/0296* (2013.01); *G11B 5/486* (2013.01); *G11B 5/4853* (2013.01); *G11B 5/4873* (2013.01); *H05K 3/06* (2013.01); *H05K 3/4007* (2013.01); *G11B 5/484* (2013.01); *H05K 1/189* (2013.01); *H05K 3/321* (2013.01); *H05K 2201/0373* (2013.01); *H05K 2201/053* (2013.01); *H05K 2201/09072* (2013.01); *H05K 2201/10083* (2013.01)

(58) Field of Classification Search
CPC .... G11B 5/4833; G11B 5/486; G11B 5/4853; G11B 5/4873; H05K 1/056; H05K 1/0296; H05K 3/06; H05K 3/4007
USPC ........................................ 174/255, 254, 25, 7
See application file for complete search history.

(56) References Cited

U.S. PATENT DOCUMENTS 6,064,216 A * 5/2000 Farnworth ......... G01R 31/2886
324/756.05
6,384,343 B1 * 5/2002 Furusawa ............ H01L 23/3107
174/250

(Continued)

FOREIGN PATENT DOCUMENTS

| JP | 2006-013160 A | 1/2006 |
| JP | 2010-251619 A | 11/2010 |
| JP | 2012-018708 A | 1/2012 |

OTHER PUBLICATIONS

Japanese Notice of Reason for Refusal issued on Dec. 8, 2015 in connection with Japanese Patent Application No. 2012-122685.

*Primary Examiner* — Steven T Sawyer
(74) *Attorney, Agent, or Firm* — Jean C. Edwards, Esq.; Edwards Neils PLLC

(57) ABSTRACT

A wired circuit board includes a wire, and a terminal formed continuously to the wire to be electrically connected to an electronic element at one surface thereof in a thickness direction of the wired circuit board. The terminal includes, at the one surface thereof in the thickness direction, a projecting portion projecting toward one side thereof in the thickness direction, and a covering layer covering one end portion of the projecting portion in the thickness direction.

9 Claims, 11 Drawing Sheets

(51) Int. Cl.
*H05K 1/18* (2006.01)
*H05K 3/32* (2006.01)

(56) References Cited

U.S. PATENT DOCUMENTS 6,388,201 B2 * 5/2002 Yamato et al. ................ 174/255
6,399,899 B1 * 6/2002 Ohkawa et al. ................ 174/261
2002/0135387 A1 * 9/2002 Kasukabe ............ H05K 3/4007
　　　　　　　　　　　　　　　　　　　　324/750.16
2003/0141596 A1 * 7/2003 Nakamura .......... H01L 21/4846
　　　　　　　　　　　　　　　　　　　　257/758
2005/0122627 A1 * 6/2005 Kanagawa et al. ........ 360/245.9
2008/0277142 A1 * 11/2008 Kanagawa et al. ............ 174/250
2012/0006586 A1    1/2012 Ohnuki

* cited by examiner

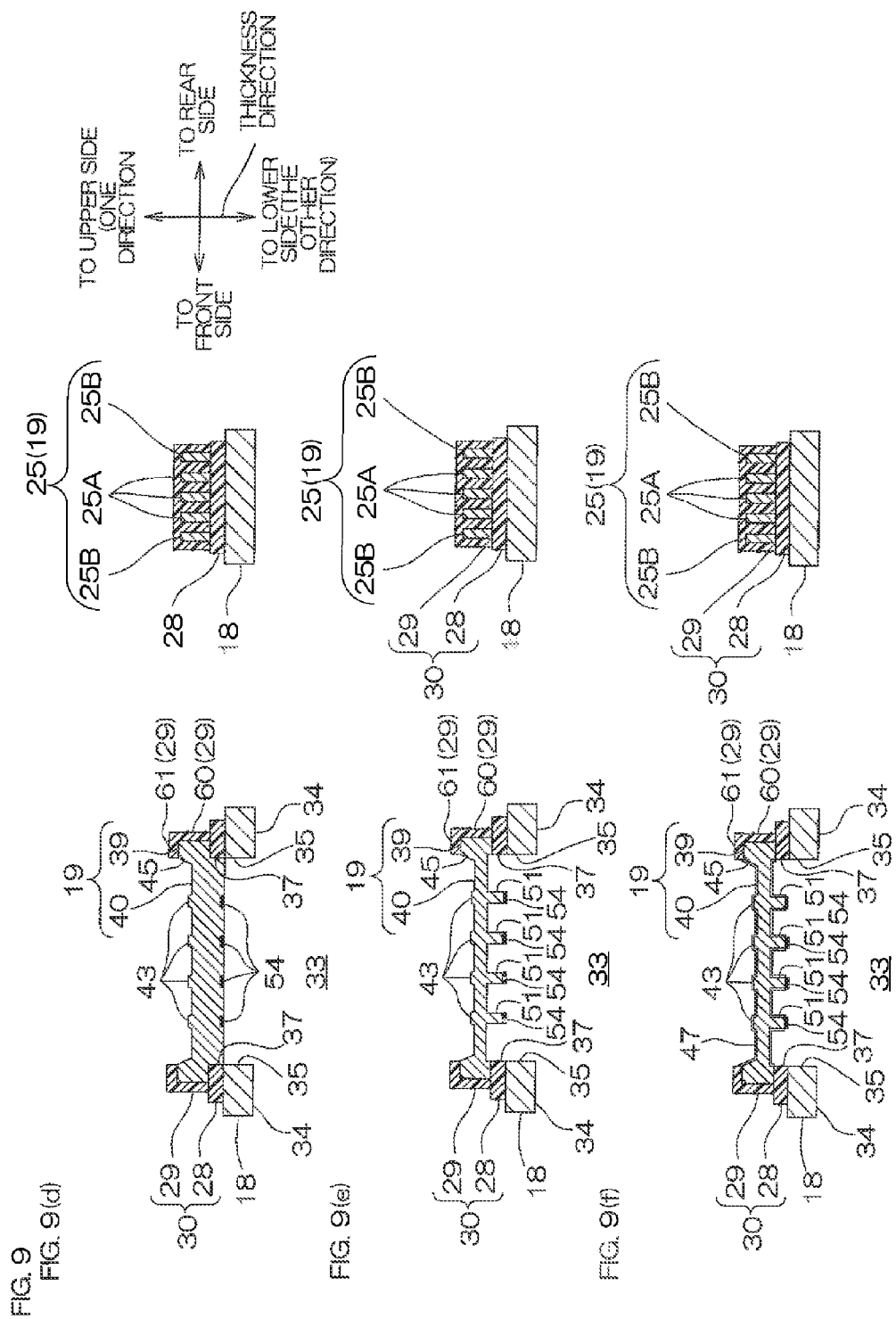

WIRED CIRCUIT BOARD AND PRODUCING METHOD THEREOF

CROSS-REFERENCE TO RELATED APPLICATION

The present application claims the benefit of U.S. Provisional Application No. 61/689,744, filed on Jun. 12, 2012, and also claims priority from Japanese Patent Application No. 2012-122685 filed on May 30, 2012, the contents of which are herein incorporated by reference into this application.

BACKGROUND OF THE INVENTION

1. Field of the Invention

The present invention relates to a wired circuit board, and particularly to a wired circuit board used preferably for a suspension board with circuit mounted in a hard disk drive, and a producing method thereof.

2. Description of the Related Art

A suspension board with circuit includes a metal supporting board, an insulating base layer formed thereon, and a conductive layer formed thereon and having head-side terminals to be connected to a magnetic head. On the suspension board with circuit, the magnetic head is mounted and connected to the head-side terminals, and the suspension board with circuit is mounted in a hard disk drive with the metal supporting board being supported on a load beam.

In recent years, it has been examined to connect such a suspension board with circuit to various electronic elements such as, e.g., a piezoelectric element (piezo-element) and accurately and finely adjust the position and angle of a magnetic head, and so forth. Because of its relatively low heat resistance, such an electronic element needs to be electrically connected to electronic-element-side terminals (terminals different from head-side terminals and formed with a conductive layer) at a relatively low temperature via a conductive adhesive or the like.

The low-temperature connection between the electronic element having low heat resistance and the electronic-element-side terminals via the conductive adhesive is lower in the strength of connection (adhesive force) between the conductive adhesive and the electronic-element-side terminals than high-temperature connection therebetween via a molten solder. Accordingly, it is required to sufficiently improve the connection strength.

In view of this, it has been proposed that, in the conductive layer of a wired circuit board, circular lands are provided with grooves (through grooves) formed along the circumferential directions of the lands to extend therethrough in the thickness direction thereof (see, e.g., Japanese Unexamined Patent Publication No. 2010-251619). In the wired circuit board described in Japanese Unexamined Patent Publication No. 2010-251619, a conductive paste is in contact with the upper surfaces of the lands and also filling the grooves. Since the upper surfaces of the lands and the inner side surfaces of the grooves are in contact with the conductive paste, the lands increase the contact area with the conductive paste to improve the adhesive force.

SUMMARY OF THE INVENTION

However, in the wired circuit board in Japanese Unexamined Patent Publication No. 2010-251619, the upper surfaces of the lands and the inner side surfaces of the grooves are in mere contact with the conductive paste, which has a limit to an increase in the contact area between the lands and the conductive paste.

On the other hand, a method is also attempted which performs roughening treatment on the surfaces of the electronic-element-side terminals to improve the adhesive force between the conductive adhesive and the electronic-element-side terminals based on an anchor effect. However, in such a method, it is necessary to provide an extra step of performing the roughening treatment on the electronic-element-side terminals. This leads to the problems of extra labor and trouble and increased production cost.

It is therefore an object of the present invention to provide a wired circuit board which allows an improvement in the reliability of the connection between an electronic element and a terminal and a method of producing the wired circuit board which allows the wired circuit board to be produced easily at low cost.

A wired circuit board of the present invention includes a wire, and a terminal formed continuously to the wire to be electrically connected to an electronic element at one surface thereof in a thickness direction of the wired circuit board. The terminal includes, at the one surface thereof in the thickness direction, a projecting portion projecting toward one side thereof in the thickness direction, and a covering layer covering one end portion of the projecting portion in the thickness direction.

In such a configuration, the terminal is formed with the projecting portion projecting toward the one side thereof in the thickness direction, and the covering layer covering the one end portion of the projecting portion in the thickness direction.

Since the terminal has the projecting portion formed at the one surface thereof in the thickness direction and the covering layer formed at the one end portion of the projecting portion in the thickness direction, compared to the case where the one surface of the terminal in the thickness direction is formed flat, the area of the terminal to be connected to the electronic element can be increased accordingly.

In particular, on the one surface of the terminal in the thickness direction, there are formed not only the projecting portion, but also the covering layer formed at the one end portion of the projecting portion in the thickness direction. Accordingly, compared to the case where only the projecting portion is formed, the area of the terminal to be connected to the electronic element can be further increased.

As a result, it is possible to improve the reliability of the connection between the electronic element and the terminal.

In the wired circuit board of the present invention, it is preferable that the terminal is to be used for being connected to the electronic element via a conductive adhesive.

In such a configuration, the area of the terminal to be connected to the electronic element is sufficiently provided. Accordingly, it is possible to improve the adhesive force between the conductive adhesive and the terminal.

Therefore, it is possible to reliably connect the terminal and the electronic element using the conductive adhesive.

It is also preferable that, in the wired circuit board of the present invention, the wire and the terminal are provided integrally in a conductive pattern, the wired circuit board further includes an insulating base layer formed on the one side of the conductive pattern in the thickness direction, and the insulating base layer is formed with a base opening exposing the one surface of the terminal in the thickness direction.

In such a configuration, it is possible to expose the one surface of the terminal in the thickness direction defined by the base opening of the insulating base layer.

This allows the insulating base layer to suppress a short circuit between the portion of the conductive pattern other than the terminal and another member, and also allows the terminal exposed from the base opening to be connected to the electronic element.

In the wired circuit board of the present invention, it is also preferable that the covering layer includes a first covering layer formed of the same material as that of the insulating base layer.

In such a configuration, the insulating base layer and the first covering layer are formed of the same material.

Therefore, it is possible to bring the first covering layer into close contact with the projecting portion using the adhesive force between the insulating base layer and the conductive pattern.

When a conductive adhesive is used, it is also possible to improve adhesion to the conductive adhesive.

Moreover, since the insulating base layer and the first covering layer are formed of the same material, the insulating base layer and the first covering layer can be formed simultaneously.

This allows a reduction in the number of production steps and a reduction in cost.

In the wired circuit board of the present invention, it is also preferable that a total sum of a thickness of the projecting portion of the terminal and a thickness of the first covering layer thereof is the same as or larger than a thickness of the insulating base layer.

Such a configuration allows a further increase in the area of the terminal to be connected to the electronic element.

Therefore, it is possible to further improve the reliability of the connection between the electronic element and the terminal.

It is also preferable that the wired circuit board of the present invention further includes a metal supporting board formed on the one side of the insulating base layer in the thickness direction, and the metal supporting board is formed with a support opening exposing the one surface of the terminal in the thickness direction.

In such a configuration, it is possible to expose the one surface of the terminal in the thickness direction defined by the support opening of the metal supporting board.

Therefore, it is possible to reinforce the terminal from the one side in the thickness direction with the metal supporting board to be able to ensure the rigidity of the terminal, and also connect the terminal exposed from the support opening to the electronic element.

In the wired circuit board of the present invention, it is also preferable that the covering layer includes a second covering layer formed of the same material as that of the metal supporting board on one end portion of the first covering layer in the thickness direction.

In such a configuration, the first covering layer is formed on the one end portion of the projecting portion in the thickness direction, and the second covering layer is further formed on the one end portion of the first covering layer in the thickness direction.

Consequently, on the one surface of the terminal in the thickness direction, there are formed not only the projecting portion and the first covering layer formed on the one end portion of the projecting portion in the thickness direction, but also the second covering layer formed on the one end portion of the first covering layer in the thickness direction. This allows a further increase in the area of the terminal to be connected to the electronic element.

As a result, it is possible to further improve the reliability of the connection between the electronic element and the terminal.

In addition, it is possible to bring the second covering layer into close contact with the first covering layer using the adhesive force between the metal supporting board and the insulating base layer.

Moreover, since the metal supporting board and the second covering layer are formed of the same material, the metal supporting board and the second covering layer can be formed simultaneously.

This allows a reduction in the number of production steps and a reduction in cost.

In the wired circuit board of the present invention, it is also preferable that the covering layer is formed of the same material as that of the metal supporting board.

In such a configuration, the covering layer covering the one end portion of the projecting portion in the thickness direction is formed of the same material as that of the metal supporting board. This allows the covering layer to be electrically connected to the electronic element.

As a result, compared to the case where the covering layer is formed of an insulating material, the area of the terminal to be connected to the electronic element can be increased.

It is also preferable that the wired circuit board of the present invention further includes an insulating cover layer formed on the other side of the conductive pattern in the thickness direction, and the insulating cover layer is formed with a cover opening exposing the other surface of the terminal in the thickness direction.

In such a configuration, it is possible to expose the other surface of the terminal in the thickness direction defined by the cover opening of the cover insulating layer.

This allows the insulating cover layer to suppress a short circuit between the portion of the conductive pattern other than the terminal and another member, and also allows the other surface of the terminal in the thickness direction to be exposed from the cover opening. Therefore, the other surface of the terminal in the thickness direction can also be used for electrical connection.

A method of producing a wired circuit board of the present invention includes preparing a metal supporting board, laminating a covering layer over the metal supporting board, laminating a conductive layer over the metal supporting board so as to cover the covering layer, etching the metal supporting board to form a support opening so as to expose lower surfaces of the conductive layer and the covering layer therefrom, and etching the conductive layer exposed from the support opening using the covering layer as an etching resist to form a terminal including a projecting portion projecting downward from the lower surface of the conductive layer, and the covering layer covering a lower end portion of the projecting portion.

According to such a producing method of a wired circuit board, first, over the metal supporting board, the covering layer is laminated and, over the metal supporting board, the conductive layer is laminated so as to cover the covering layer. Then, the foregoing metal supporting board is etched to expose the lower surfaces of the conductive layer and the covering layer. Subsequently, using the covering layer as an etching resist, the conductive layer is etched. In this manner, it is possible to form the terminal including the projecting portion projecting downward from the lower surface thereof, and the covering layer covering the lower end portion of the projecting portion.

Thus, the conductive layer can be etched using the covering layer as the etching resist. Accordingly, the covering layer and the projecting portion can be formed more efficiently than in the case of forming the covering layer after forming the projecting portion.

As a result, it is possible to easily obtain the wired circuit board which is excellent in the reliability of the connection with the electronic element at low cost.

It is preferable that the method of producing a wired circuit board of the present invention further includes laminating the covering layer over the metal supporting board and simultaneously laminating an insulating base layer formed of the same material as that of the covering layer so as to form a base opening surrounding the covering layer.

According to such a method of producing a wired circuit board, the insulating base layer and the covering layer which are formed of the same material can be formed simultaneously.

This allows the insulating base layer and the covering layer to be efficiently formed, and allows the production process to be simplified.

Alternatively, the method of producing a wired circuit board of the present invention includes preparing a metal supporting board, laminating a first covering layer over the metal supporting board, laminating a conductive layer over the metal supporting board so as to cover the first covering layer, etching the metal supporting board to form a support opening and a second covering layer so as to expose a lower surface of the conductive layer therefrom, and etching the conductive layer exposed from the support opening using the second covering layer as an etching resist to form a terminal including a projecting portion projecting downward from the lower surface of the conductive layer, the first covering layer covering a lower end portion of the projecting portion, and the second covering layer covering a lower end portion of the first covering layer.

According to such a producing method of a wired circuit board, first, over the metal supporting board, the first covering layer is laminated and, over the metal supporting board, the conductive layer is laminated so as to cover the first covering layer. Then, the foregoing metal supporting board is etched to form the support opening and the second covering layer to expose the lower surface of the conductive layer. Subsequently, using the second covering layer as an etching resist, the conductive layer is etched. In this manner, it is possible to form the terminal including the projecting portion projecting downward from the lower surface thereof, the first covering layer covering the lower end portion of the projecting portion, and the second covering layer covering the lower end portion of the first covering layer.

Thus, the conductive layer can be etched using the second covering layer as the etching resist. Accordingly, the first covering layer, the second covering layer, and the projecting portion can be formed more efficiently than in the case of forming the first covering layer and the second covering layer after forming the projecting portion.

Consequently, on the one surface of the terminal in the thickness direction, there can be formed not only the projecting portion and the first covering layer formed on the one end portion of the projecting portion in the thickness direction, but also the second covering layer formed on the one end portion of the first covering layer in the thickness direction. This allows a further increase in the area of the terminal to be connected to the electronic element.

Therefore, it is possible to easily obtain the wired circuit board which is excellent in the reliability of the connection with the electronic element at low cost.

Alternatively, the method of producing a wired circuit board includes preparing a metal supporting board, laminating a conductive layer over the metal supporting board, etching the metal supporting board to form a support opening and a covering layer so as to expose a lower surface of the conductive layer therefrom, and etching the conductive layer exposed from the support opening using the covering layer as an etching resist to form a terminal including a projecting portion projecting downward from the lower surface of the conductive layer, and the covering layer covering a lower end portion of the projecting portion.

According to such a producing method of a wired circuit board, first, over the metal supporting board, the conductive layer is laminated. Then, the metal supporting board is etched to form the support opening and the covering layer to expose the lower surface of the conductive layer. Subsequently, using the covering layer as an etching resist, the conductive layer is etched. In this manner, it is possible to form the terminal including the projecting portion projecting downward from the lower surface thereof, and the covering layer covering the lower end portion of the projecting portion.

Thus, the conductive layer can be etched using the covering layer as the etching resist. Accordingly, the covering layer and the projecting portion can be formed more efficiently than in the case of forming the covering layer after forming the projecting portion.

As a result, the one end portion of the projecting portion in the thickness direction can be covered with the covering layer formed of the same material as that of the metal supporting board. This allows the covering layer to be electrically connected to the electronic element.

Therefore, it is possible to easily obtain the wired circuit board which is excellent in the reliability of the connection with the electronic element at low cost.

With the wired circuit board of the present invention and the producing method thereof, it is possible to sufficiently improve the reliability of the connection between the electronic element and the terminal and also easily produce the wired circuit board at low cost.

BRIEF DESCRIPTION OF THE DRAWINGS

FIG. 9 is a process view illustrating the producing method of the suspension board with circuit, subsequently to FIG. 8, FIG. 9 (d) showing the step of removing the metal supporting board and forming a support opening, FIG. 9 (e) showing the step of removing the piezoelectric-side terminal and forming projecting portions, and FIG. 9 (f) showing the step of forming protective thin films;

DETAILED DESCRIPTION OF THE INVENTION

Figure 1:
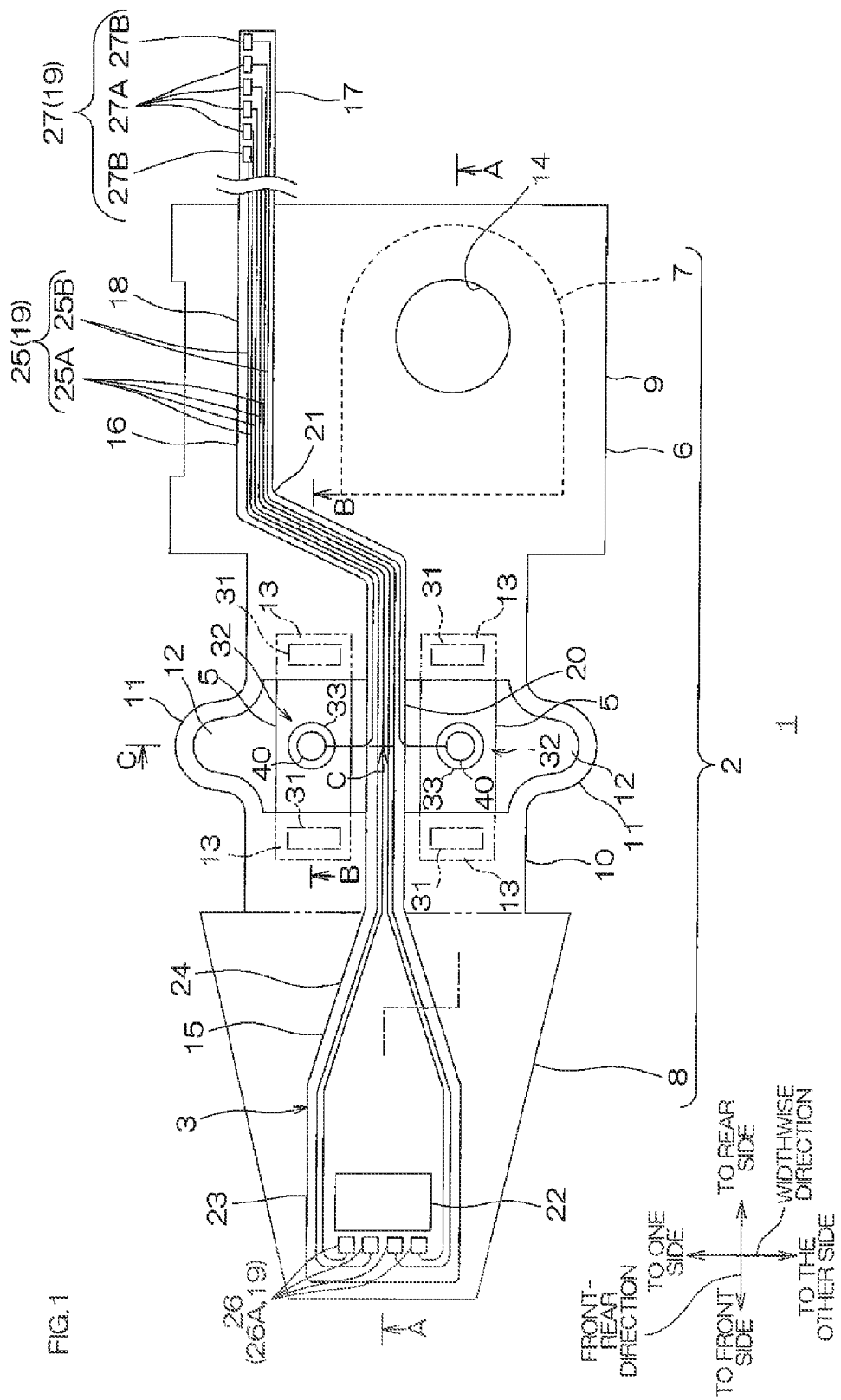
FIG. 1 shows a plan view of an assembly including a suspension board with circuit as an embodiment of the wired circuit board of the present invention.
Figure 2:
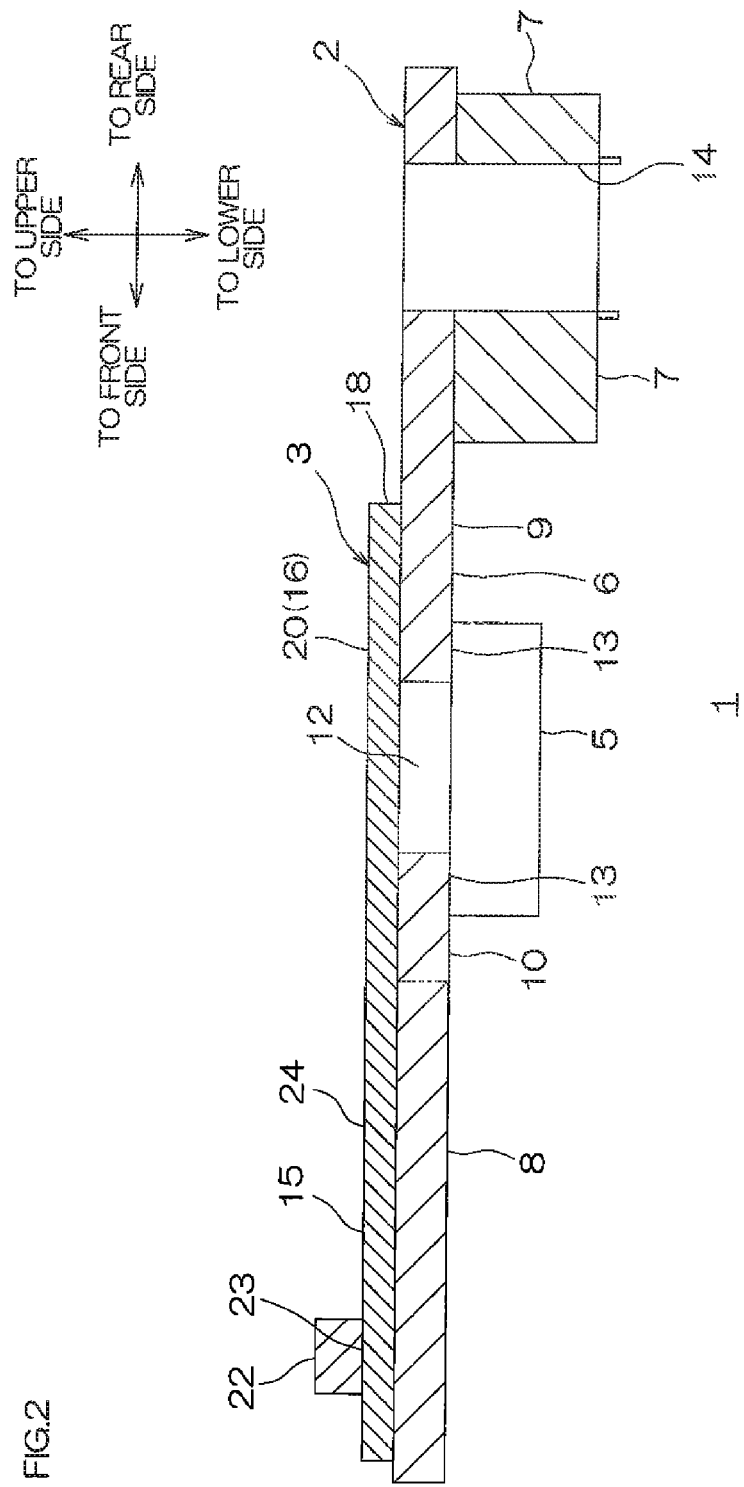
FIG. 2 shows a cross-sectional view of the assembly shown in FIG. 1 along the line A-A.
Figure 3:
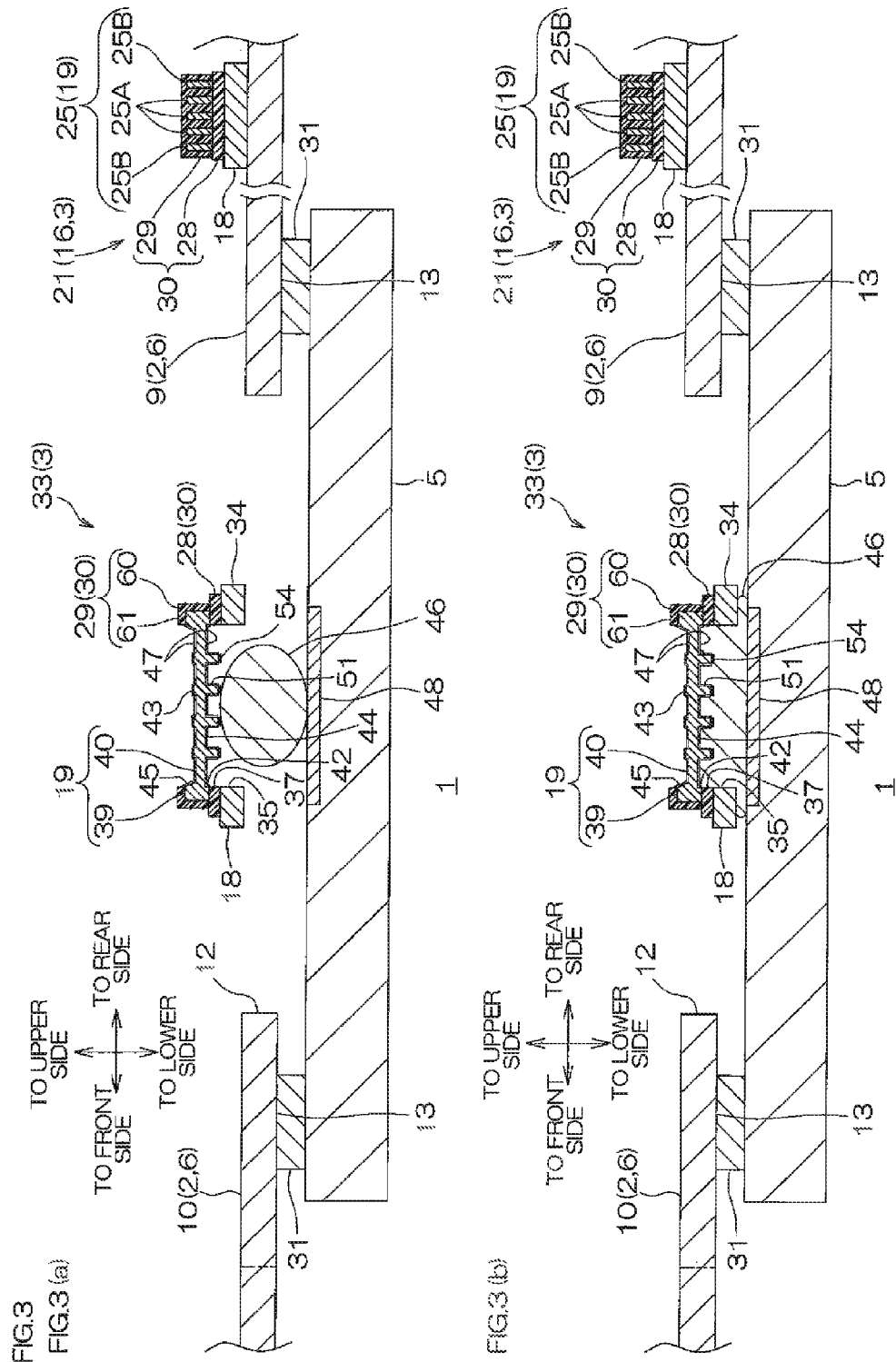
FIG. 3 shows a cross-sectional view of the assembly shown in FIG. 1 along the line B-B, FIG. 3 (*a*) showing a state in which a conductive adhesive is interposed between a piezoelectric-side terminal and a piezoelectric element, and FIG. 3 (*b*) showing a state in which the piezoelectric-side terminal and the piezoelectric element are electrically connected and an outer contact portion and a piezoelectric terminal are connected via the conductive adhesive.
Figure 4:
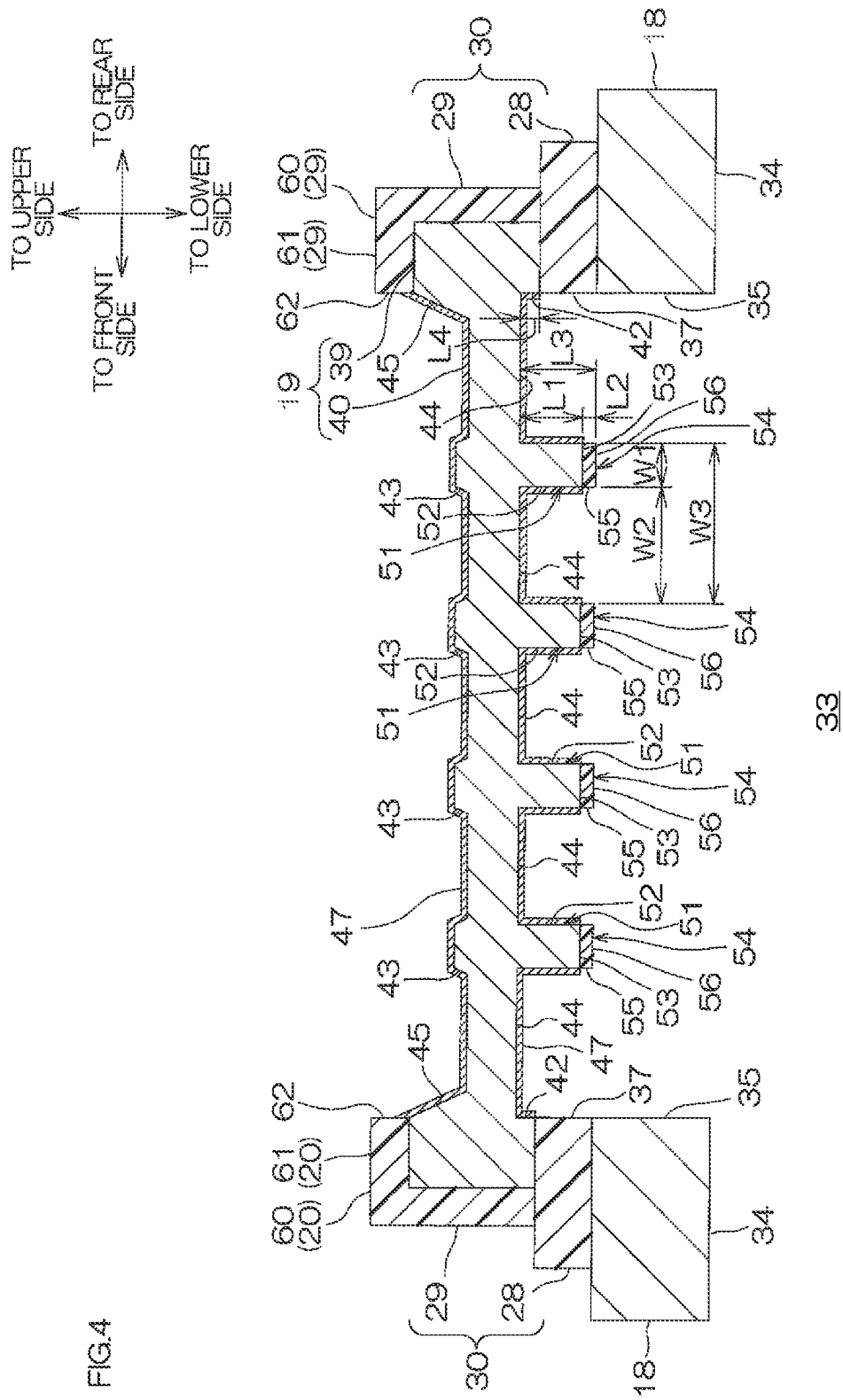
FIG. 4 shows an enlarged cross-sectional view of the piezoelectric-side terminal of the assembly shown in FIG. 3.
Figure 5:
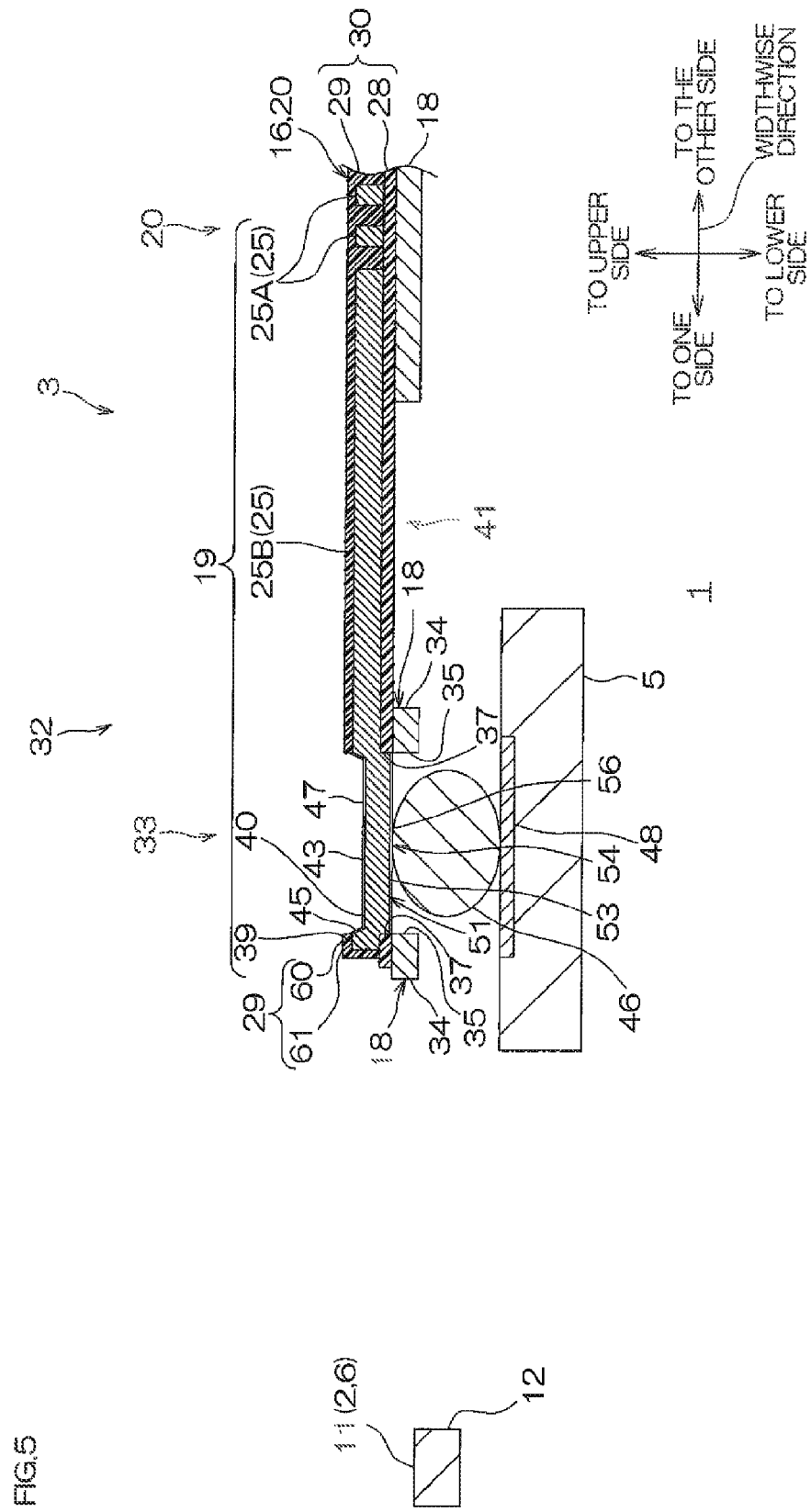
FIG. 5 shows a cross-sectional view of the assembly shown in FIG. 1 along the line C-C.
Figure 6:
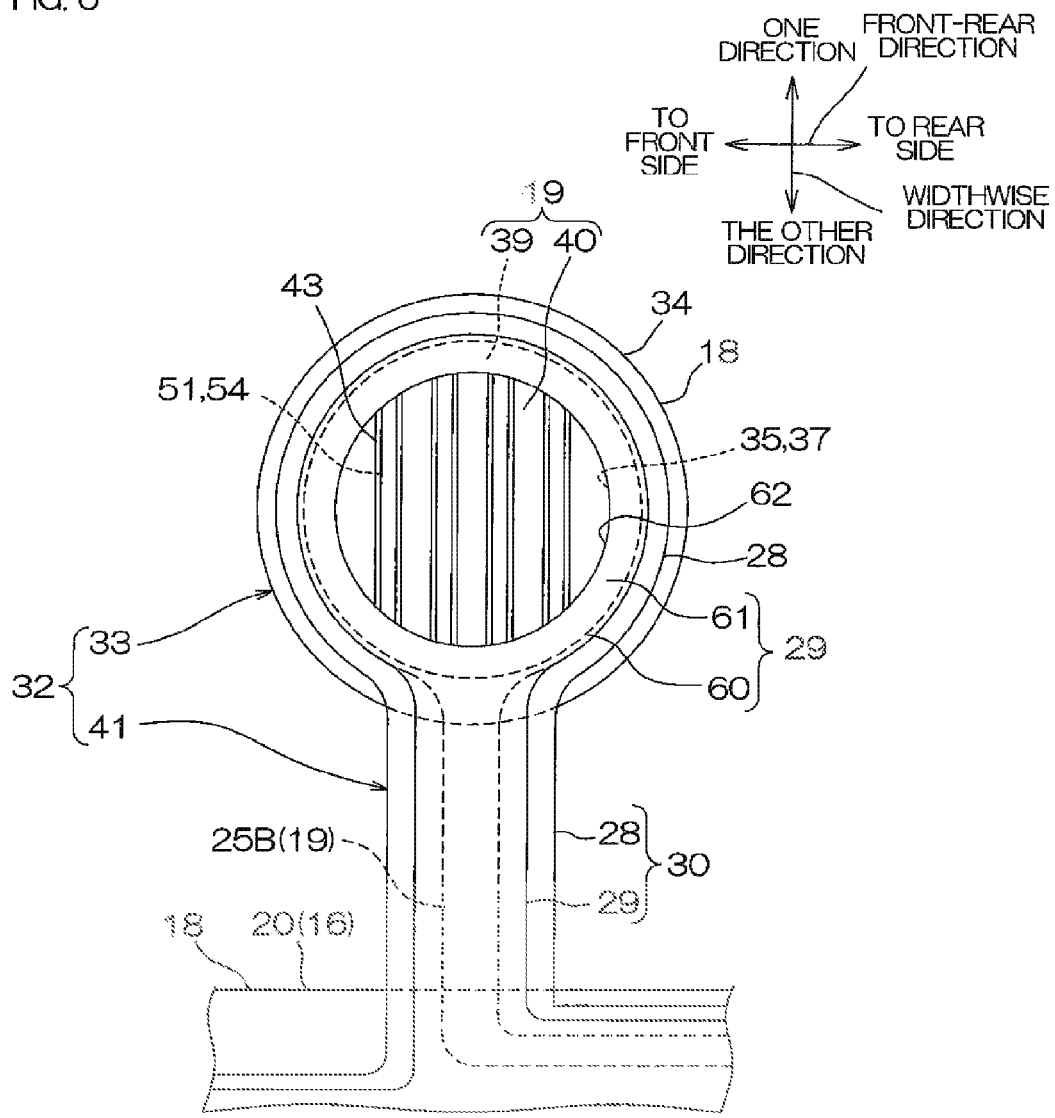
FIG. 6 shows an enlarged plan view of the connecting arm of the assembly shown in FIG. 1.
Figure 7:
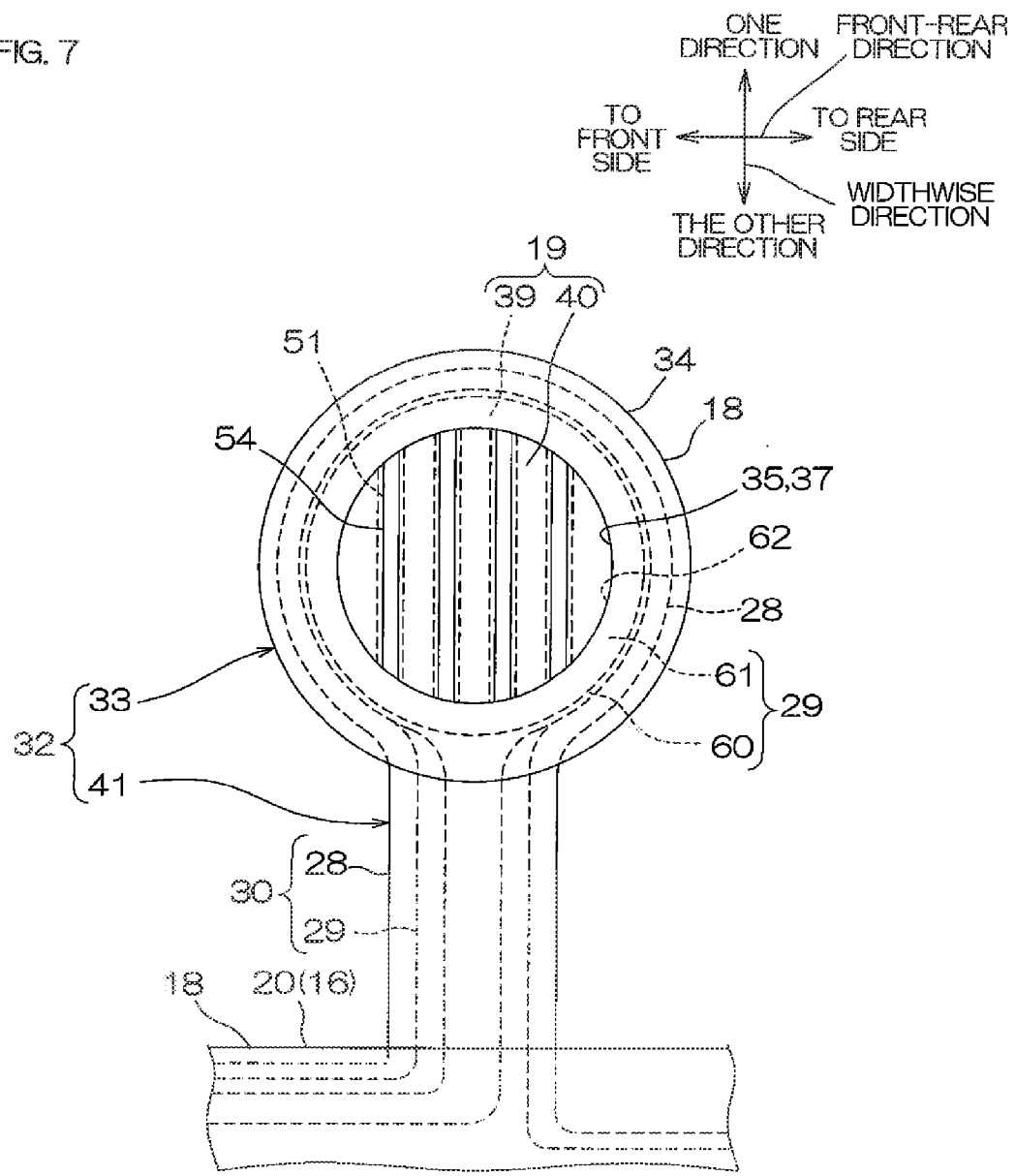
FIG. 7 shows an enlarged bottom view of the connecting arm of the assembly shown in FIG. 1.
Figures 8, 8A, 8B, 8C:
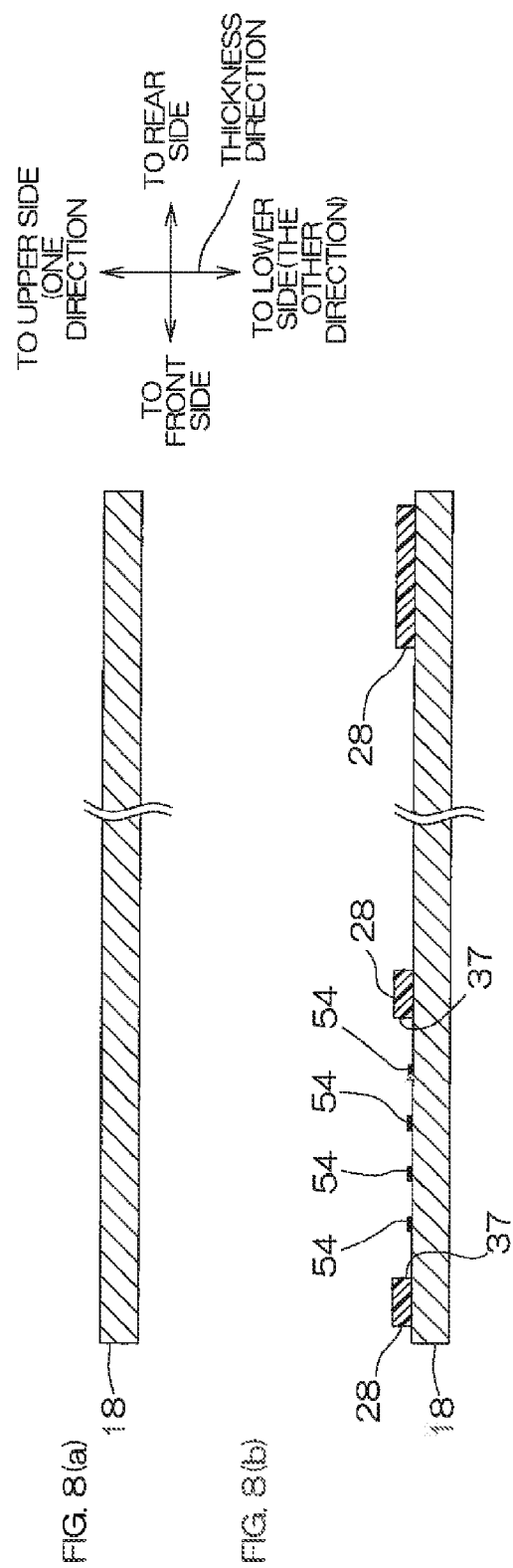
FIG. 8 is a process view illustrating a producing method of the suspension board with circuit, FIG. 8 (*a*) showing the step of preparing a metal supporting board, FIG. 8 (b) showing the step of forming an insulating base layer, and FIG. 8 (c) showing the step of forming a conductive layer.

FIG. 1 shows a plan view of an assembly including a suspension board with circuit as an embodiment of the wired circuit board of the present invention. FIG. 2 shows a cross-sectional view of the assembly shown in FIG. 1 along the line A-A. FIG. 3 shows a cross-sectional view of the assembly shown in FIG. 1 along the line B-B. FIG. 4 shows an enlarged cross-sectional view of the piezoelectric-side terminal of the assembly shown in FIG. 3. FIG. 5 shows a cross-sectional view of the assembly shown in FIG. 1 along the line C-C. FIG. 6 shows an enlarged plan view of the connecting arm of the assembly shown in FIG. 1. FIG. 7 shows an enlarged bottom view of the connecting arm of the assembly shown in FIG. 1. FIGS. 8 and 9 are process views each illustrating a producing method of the suspension board with circuit.

Note that, in FIG. 1, an insulating base layer 28 and an insulating cover layer 29 are omitted for clear illustration of relative positioning of a metal supporting board 18 and a conductive pattern 19.

In FIGS. 1 and 2, an assembly 1 is a head-stack assembly (HSA) to be mounted in a hard disk drive (not shown). In the assembly 1, a suspension board with circuit 3 as an example of the wired circuit board on which a slider 22 mounting a magnetic head (not shown) is mounted is supported on a support plate 2. The assembly 1 includes the support plate 2, the suspension board with circuit 3 disposed on the support plate 2 (on the other side thereof in the thickness direction, which similarly applies to the following) and supported on the support plate 2, and piezoelectric elements (piezo-elements) 5 as an example of electronic elements for accurately and finely adjusting the position and angle of the suspension board with circuit 3, while being supported on the support plate 2.

The support plate 2 is formed so as to extend in a longitudinal direction (front-rear direction), and includes an actuator plate portion 6, a base plate portion 7 formed under the actuator plate portion 6 (on one side thereof in the thickness direction, which similarly applies to the following), and a load beam portion 8 formed to be continued to the front side of the actuator plate portion 6.

The actuator plate portion 6 integrally includes a rear plate portion 9, a front plate portion 10 disposed on the front side of the rear plate portion 9 to be spaced apart therefrom, and flexible portions 11 formed between the rear plate portion 9 and the front plate portion 10.

The rear plate portion 9 is formed in a generally rectangular shape (generally projecting shape) in plan view in the rear end portion of the actuator plate portion 6.

The front plate portion 10 is formed in a generally rectangular shape in plan view extending in a widthwise direction (direction perpendicular to the front-rear direction).

The flexible portions 11 are provided on both widthwise sides of the actuator plate portion 6. Each of the flexible portions 11 is formed to extend between the front end portion of the rear plate portion 9 and the rear end portion of the front plate portion 10.

The both flexible portions 11 have respective middle portions thereof in the front-rear direction which are formed to be curved outwardly on both widthwise sides and have generally equal widths throughout the front-rear direction. Specifically, the middle portions of the flexible portions 11 in the front-rear direction are formed so as to outwardly protrude into generally U-shapes (or generally V-shapes) on both widthwise sides.

Accordingly, the flexible portions 11 can warp in the front-rear direction and are formed to be able to bring the front plate portion 10 away from and closer to the rear plate portion 9 due to the extension/contraction of the piezoelectric elements 5, as described later.

The actuator plate portion 6 is also formed with a plate opening 12 defined by the front surface of the rear plate portion 9, the rear surface of the front plate portion 10, and the widthwise inner surfaces of the flexible portions 11. The plate opening 12 extends through the actuator plate portion 6 in the thickness direction thereof.

In the front end portion of the rear plate portion 9 and the rear end portion of the front plate portion 10, two pairs of attachment regions 13 to which the rear end portions and front end portions of the piezoelectric elements 5 are respectively attached are defined. The attachment regions 13 are each defined in a widthwise elongated generally rectangular shape in bottom view in one widthwise end portion and the other widthwise end portion of each of the front end portion of the rear plate portion 9 and the rear end portion of the front plate portion 10 located to face the front end portion in the front-rear direction.

The base plate portion 7 is fixed to the middle portion of the lower surface of the rear plate portion 9 in each of the widthwise direction and the front-rear direction. The base plate portion 7 has a front portion thereof formed in a generally rectangular shape and a rear portion thereof formed in a generally semi-circular shape when viewed in plan view.

The support plate 2 is formed with a hole 14 having a generally circular shape in bottom view and extending through the middle portion of the rear plate portion 9 and the middle portion of the base plate portion 7.

Note that, to the base plate portion 7, a drive coil (not shown) for causing the front end portion of the assembly 1 to swing around the hole 14 is attached.

The load beam portion 8 is integrally formed with the actuator plate portion 6. Specifically, the load beam portion 8 is formed to extend from the front end of the front plate portion 10 toward the front side, and formed in a generally trapezoidal shape which gradually decreases in width with approach to the frontmost portion when viewed in plan view.

The support plate 2 is formed of a metal material such as, e.g., stainless steel, aluminum, iron, or an alloy thereof.

The size of the support plate 2 is set appropriately. For example, the thickness of each of the actuator plate portion 6 and the load beam portion 8 is in a range of, e.g., 30 to 150 μm, and the thickness of the base plate portion 7 is in a range of, e.g., 150 to 200 μm.

Note that the support plate 2 is provided as an integrated actuator-plate/load-beam plate integrally including the actuator plate portion 6 and the load beam portion 8.

The suspension board with circuit 3 is formed in a generally flat-belt shape in plan view extending in the front-rear direction.

As shown in FIG. 1, the suspension board with circuit 3 includes the metal supporting board 18 and the conductive layer 19 supported on the metal supporting board 18.

The metal supporting board 18 is formed so as to correspond to the outer shape of the suspension board with circuit 3, and integrally includes a wiring portion 16, a front portion 15 formed on the front side of the wiring portion 16, and a rear portion 17 formed on the rear side of the wiring portion 16.

The wiring portion 16 integrally includes a linear portion 20 formed in the middle portion of the metal supporting board 18 in the front-rear direction and extending in the front-rear direction, and a bent portion 21 bent to one side in the widthwise direction from the rear end portion of the linear portion 20, and then further bent rearward. Note that the linear portion 20 and the bent portion 21 are formed to have generally equal widths throughout the front-rear direction.

The front portion 15 is formed in a generally rectangular shape in plan view continued from the front end of the linear portion 20 and gradually protruding outward on both widthwise sides from the wiring portion 16. Specifically, the front portion 15 includes a gimbal 23 on which the slider 22 (described later) is mounted, and a gimbal rear portion 24 connecting the gimbal 23 and the linear portion 20.

The gimbal 23 is formed in a generally rectangular shape in plan view having a width larger than the width of the linear portion 20. The gimbal 23 supports front-side terminals 26 (described later), and the slider 22 (described later) having the magnetic head (not shown) electrically connected to the front-side terminals 26 (described later) is mounted on the gimbal 23.

The gimbal rear portion 24 is formed in a generally triangular shape continued to the rear end of the gimbal 23 and gradually decreasing in width with approach to the rearmost portion. To the rear end of the gimbal rear portion 24, the front end of the linear portion 20 is continued.

The rear portion 17 is formed in a generally rectangular shape in plan view continued from the rear end of the bent portion 21 and having generally the same width as that of the bent portion 21.

The conductive pattern 19 integrally includes wires 25 extending along the front-rear direction, the front-side terminals 26 continued to the front end portions of the wires 25, and rear-side terminals 27 continued to the rear end portions of the wires 25 at the upper surface of the metal supporting board 18.

The wires 25 include signal wires 25A each for transmitting an electric signal between the magnetic head (not shown) and a read/write board (not shown), and disposed along the rear portion 17, the bent portion 21, the linear portion 20, the gimbal rear portion 24, and the gimbal 23 throughout the front-rear direction of the suspension board with circuit 3. The plurality of (four) signal wires 25A are arranged in widthwise spaced-apart relation.

The wires 25 also include a plurality of (two) power-source wires 25B.

The power-source wires 25B are electrically connected to power-source-side terminals 27B described next. The power-source wires 25B are disposed to be continued to the power-source-side terminals 27B in the rear portion 17, arranged in parallel and spaced-apart relation on both sides of the signal wires 25A in the rear portion 17, the bent portion 21, and the linear portion 20, and curved outwardly on both widthwise sides in the middle portion of the linear portion 20 in the front-rear direction to reach frame conductors 39 (see FIG. 6) described later.

The front-side terminals 26 are disposed on the front portion 15. Specifically, the plurality of (four) front-side terminals 26 are arranged along the front end surface of the slider 22 in widthwise spaced-apart relation on the front side of the gimbal 23.

The front-side terminals 26 are head-side terminals 26A electrically connected to the magnetic head (not shown).

The rear-side terminals 27 are disposed on the rear end portion of the rear portion 17. Specifically, the plurality of (six) rear-side terminals 27 are arranged to be spaced apart from each other in the front-rear direction. The rear-side terminals 27 include a plurality of (four) external terminals 27A continued to the signal wires 25A, and connected to the terminals of the read/write board.

The rear-side terminals 27 also include the plurality of (two) power-source-side terminals 27B continued to the power-source wires 25B and electrically connected to the piezoelectric elements 5. Note that the power-source-side terminals 27B are disposed in spaced-apart relation on both sides of the external terminals 27A in the front-rear direction, and electrically connected to a power source (not shown).

As shown in FIGS. 3 and 5, the suspension board with circuit 3 includes the metal supporting board 18, an insulating layer 30 formed on the upper surface thereof, and the conductive pattern 19 covered with the insulating layer 30.

The metal supporting board 18 is formed of a metal material such as, e.g., stainless steel, a 42-alloy, aluminum, a copper-beryllium alloy, or phosphor bronze. Preferably, the metal supporting board 18 is formed of stainless steel. The thickness of the metal supporting board 18 is in a range of, e.g., 15 to 50 µm, or preferably 15 to 20 µm.

The insulating layer 30 includes the insulating base layer 28 formed on the upper surface of the metal supporting board 18, and the insulating cover layer 29 formed over the insulating base layer 28 so as to cover the wires 25.

As shown in FIG. 1, the insulating base layer 28 is formed in a pattern corresponding to the conductive pattern 19 on the upper surface of the metal supporting board 18 in the front portion 15, the wiring portion 16, and the rear portion 17.

The insulating base layer 28 is formed of an insulating material such as a synthetic resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. Preferably, the insulating base layer 28 is formed of a polyimide resin.

The thickness (maximum thickness) of the insulating base layer 28 is in a range of, e.g., 1 to 35 µm, or preferably 8 to 15 µm.

The insulating cover layer 29 is formed over the wiring portion 16, the front portion 15, and the rear portion 17 so as to cover the upper surfaces of the insulating base layer 28 exposed from the wires 25 and the upper surface and side surfaces of the wires 25. The insulating cover layer 29 is also formed in a pattern exposing the front-side terminals 26 in the front portion 15 and exposing the rear-side terminals 27 in the rear portion 17, though not shown.

The insulating cover layer 29 is formed of the same insulating material as the insulating material of the insulating base layer 28. The thickness of the insulating cover layer 29 is in a range of, e.g., 1 to 40 µm, or preferably 1 to 10 µm.

As shown in FIGS. 1 and 3, the conductive pattern 19 is formed in the foregoing pattern over the upper surface of the insulating base layer 28 in the front portion 15, the wiring portion 16, and the rear portion 17.

The conductive layer 19 is formed of a conductive material such as metal such as, e.g., copper, nickel, gold, or a solder or an alloy thereof. Preferably, the conductive layer 19 is formed of copper.

The thickness of the conductive pattern 19 is in a range of, e.g., 3 to 15 µm, or preferably 5 to 10 µm.

The width of each of the wires 25 is in a range of, e.g., 5 to 200 µm, or preferably 8 to 100 µm. The spacing between the individual wires 25 is in a range of, e.g., 5 to 1000 µm, or preferably 8 to 100 µm.

The widths and lengths of the front-side terminals 26 and the rear-side terminals 27 are in a range of, e.g., 20 to 1000 µm, or preferably 30 to 800 µm. The spacing between the individual front-side terminals 26 and the spacing between the individual rear-side terminals 27 are in a range of, e.g., 20 to 1000 µm, or preferably 30 to 800 µm.

In the suspension board with circuit 3, as shown in FIGS. 1 and 2, the lower surface of the metal supporting board 18 is supported on the support plate 2. Specifically, the lower surfaces of the wiring portion 16 and the front portion 15 are supported on the support plate 2, while the lower surface of the rear portion 17 protrudes rearward from the support plate 2 without being supported on the support plate 2.

Specifically, in the suspension board with circuit 3, the bent portion 21 is disposed in a generally L-shape along the one widthwise end portion of the rear plate portion 9 and the front end portion thereof, and the linear portion 20 is disposed to extend from the widthwise middle portion of the front end portion of the rear plate portion 9, traverse the widthwise middle portion of the plate opening 12, and then reach the widthwise middle portion of the front plate portion 10. Also, in the suspension board with circuit 3, the front portion 15 is disposed to be formed on the widthwise middle portion of the load beam portion 8 to extend throughout the front-rear direction of the load beam portion 8.

The piezoelectric elements 5 are attached to the lower side of the support plate 2.

Specifically, the plurality of (two) piezoelectric elements 5 are provided in widthwise spaced-apart relation.

Each of the piezoelectric elements 5 is an actuator extendable/contractable in the front-rear direction, and is formed in a generally rectangular shape in plan view elongated in the front-rear direction. Each of the piezoelectric elements 5 is disposed so as to span the plate opening 12 in the front-rear direction.

Specifically, the both end portions of each of the piezoelectric elements 5 in the front-rear direction are bonded to the respective attachment regions 13 (broken lines of FIG. 1) in the front end portion of the rear plate portion 9 and in the rear end portion of the front plate portion 10 via adhesive layers 31, and fixed thereto.

As shown in FIG. 3, in the middle portion of the upper surface of each of the piezoelectric elements 5 in the front-rear direction, a piezoelectric terminal 48 is provided, and electrically connected to a piezoelectric-side terminal 40 (described later) of the suspension board with circuit 3 via a conductive adhesive 46.

Each of the piezoelectric elements 5 is supplied with electricity from the piezoelectric-side terminal 40 and the piezoelectric terminal 48, and the voltage thereof is controlled to extend/contract the piezoelectric element 5.

Next, a detailed description is given to the piezoelectric-side terminal 40 on one widthwise side in the suspension board with circuit 3. The piezoelectric-side terminal 40 and the wires 25 are integrally included in the conductive pattern 19. Note that the piezoelectric-side terminal 40 on the other widthwise side is formed to be symmetrical with the piezoelectric-side terminal 40 on the one widthwise side with respect to the linear portion 20, and a description thereof is omitted.

In the suspension board with circuit 3, as shown in FIG. 6, connecting arms 32 each including the piezoelectric-side terminal 40 are provided.

Each of the connecting arms 32 is provided so as to protrude widthwise outward in an arm-like shape from the middle portion of the linear portion 20 in the front-rear direction thereof.

The connecting arm 32 includes a pad portion 33 disposed on one widthwise side of the linear portion 20 to be spaced apart therefrom, and a joint portion 41 coupling the pad portion 33 to the linear portion 20.

As shown in FIG. 4, each of the pad portions 33 includes the insulating base layer 28, the conductive pattern 19 formed on the upper surface of the insulating base layer 28, and the insulating cover layer 29 formed on the upper surface of the insulating base layer 28 and around the conductive pattern 19.

In the pad portion 33, as shown in FIGS. 6 and 7, the metal supporting board 18 is formed as a support pad 34 having a generally annular (ring) shape in plan view. That is, as shown in FIG. 3, the middle portion of the support pad 34 is formed with a support opening 35 having a generally circular shape in plan view and extending therethrough in the thickness direction.

In the pad portion 33, as shown in FIGS. 4 and 6, the insulating base layer 28 is formed in a generally annular (ring) shape in plan view slightly smaller than the support pad 34. The middle portion of the insulating base layer 28 is formed with a base opening 37 having a generally circular shape in plan view and extending therethrough in the thickness direction. The insulating base layer 28 is formed such that the diameter of the base opening 37 thereof has the same diameter as the inner diameter of the support pad 34 (diameter of the support opening 35) and the outer diameter thereof is smaller than the outer diameter of the support pad 34.

That is, as shown in FIG. 4, the insulating base layer 28 is formed to overlap the support pad 34 when projected in the thickness direction. In other words, the insulating base layer 28 is laminated on the upper surface of the support pad 34.

As shown in FIGS. 4 and 6, the conductive pattern 19 integrally includes the frame conductor 39 formed on the upper surface of the insulating base layer 28, and the piezoelectric-side terminal 40 as an example of a terminal continued to the inside of the frame conductor 39.

As shown in FIG. 6, the frame conductor 39 is formed in a generally annular (ring) shape in plan view smaller than the insulating base layer 28. Specifically, as shown in FIG. 4, the frame conductor 39 is formed such that the outer diameter thereof is smaller than the outer diameter of the insulating base layer 28 and the inner diameter thereof is generally the same as the inner diameter of the insulating base layer 28 (diameter of the base opening 37) when projected in the thickness direction. That is, the frame conductor 39 is laminated on the upper surface of the inner peripheral portion of the insulating base layer 28.

As shown in FIG. 6, the piezoelectric-side terminal 40 is formed in a generally circular shape in plan view continued to the inner peripheral portion of the frame conductor 39.

The upper surface of the piezoelectric-side terminal 40 is formed below the upper surface of the frame conductor 39, and the lower surface of the piezoelectric-side terminal 40 is formed above the lower surface of the frame conductor 39. That is, the piezoelectric-side terminal 40 is formed thinner than the frame conductor 39.

On the upper surface of the outer peripheral end portion of the piezoelectric-side terminal 40, a connecting portion 45 is formed.

The connecting portion 45 is inclined to the upper surface of the frame conductor 39 so as to be gradually thickened with distance from a radially inner portion toward a radially outer portion.

The lower surface of the outer peripheral end portion of the piezoelectric-side terminal 40 is formed with a stepped portion 42.

The stepped portion 42 is formed resulting from the height difference between the lower surface of the piezoelectric-side terminal 40 and the lower surface of the frame conductor 39 in an up-down direction.

As shown in FIGS. 3 and 4, the piezoelectric-side terminal 40 is provided with projecting portions 51 projecting downward from the lower surface thereof.

Specifically, as shown in FIGS. 4 and 7, the plurality of (e.g., four) projecting portions 51 are formed to be spaced apart from each other in the front-rear direction into a stripe (striped) pattern in bottom view. Each of the projecting portions 51 is in the form of a projected rim extending along the widthwise direction and has the both widthwise end portions thereof in contact with the peripheral surface of the base opening 37 of the insulating base layer 28, as shown in FIG. 5.

As shown in FIG. 4, the lower surface of each of the projecting portions 51 is formed to be located above the lower surface of the insulating base layer 28.

Note that the individual projecting portions 51 have the side surfaces thereof defined as projecting-portion side surfaces 52 and the lower surfaces thereof defined as projecting-portion bottom surfaces 53.

The individual projecting-portion bottom surfaces 53 have covering base layers 54 which are provided thereon as an example of the covering layer and the first covering layer so as to cover the projecting portions 51 from therebelow.

As shown in FIG. 7, each of the covering base layers 54 is formed to have the same shape as that of the projecting portion 51 when projected in the up-down direction. Also, as shown in FIG. 5, the covering base layer 54 is formed such that the upper surface thereof is bonded to the projecting-portion bottom surface 53 and the lower surface thereof is at the same height as that of the lower surface of the insulating base layer 28. The both widthwise end portions of the covering base layer 54 are continued to the insulating base layer 28.

The covering base layers 54 are formed of the same insulating material as the insulating material of the insulating base layer 28.

Note that, as shown in FIG. 4, the covering base layers 54 have the side surfaces thereof defined as covering-base side surfaces 55 and the lower surfaces thereof defined as covering-base bottom surfaces 56.

Note that the upper surface portions of each of the piezoelectric-side terminals 40 which overlap the projecting portions 51 when projected in the up-down direction are formed with protruding portions 43 which are upwardly protruding by the thicknesses of the covering base layers 54 (described later).

Also, when projected in the up-down direction, the lower surface portions of the piezoelectric-side terminal 40 other than the projecting portions 51 are defined as terminal exposed surfaces 44 each formed of a flat surface. That is, at the lower surface of the piezoelectric-side terminal 40, the terminal exposed surfaces 44 are exposed from the base opening 37 of the insulating base layer 28 and the support opening 35 of the support pad 34.

In the pad portion 33, as shown in FIGS. 4 and 6, the insulating cover layer 29 includes a cover outer peripheral portion 60 and a cover inner peripheral portion 61.

As shown in FIG. 6, the cover outer peripheral portion 60 is formed in a generally annular (ring) shape in plan view which covers the outer peripheral surface of the frame conductor 39. The cover outer peripheral portion 60 is formed such that the outer diameter thereof is slightly smaller than the outer diameter of the insulating base layer 28.

As shown in FIG. 4, the cover inner peripheral portion 61 is formed so as to inwardly project from the inner peripheral surface of the upper portion of the cover outer peripheral portion 60 and cover the upper surface of the frame conductor 39. The center portion of the cover inner peripheral portion 61 is formed with a cover opening 62 having a generally circular shape in plan view and extending therethrough in the thickness direction. The cover inner peripheral portion 61 is formed such that the diameter of the cover opening 62 thereof is generally the same as the inner diameter of the insulating base layer 28 (diameter of the base opening 37).

From the cover opening 62, the upper surface of the piezoelectric-side terminal 40 is exposed.

The dimensions of the pad portion 33 are selectively determined appropriately. As shown in FIG. 7, the outer diameter (maximum length) of the support pad 34 is in a range of, e.g., 100 to 1000 μm, and the inner diameter of the support pad 34 (diameter of the support opening 35) is in a range of, e.g., 50 to 990 μm.

As shown in FIG. 6, the outer diameter (maximum length) of the insulating base layer 28 is in a range of, e.g., 100 to 1000 μm and, as shown in FIG. 7, the inner diameter of the insulating base layer 28 (diameter of the base opening 37) is the same as the inner diameter of the support pad 34 (diameter of the support opening 35).

Also, as shown in FIG. 6, the outer diameter (maximum length) of the frame conductor 39 of the conductive pattern 19 is in a range of, e.g., 90 to 990 μm and, as shown in FIG. 7, the inner diameter of the frame conductor 39 of the conductive pattern 19 (outer diameter of the piezoelectric-side terminal 40) is generally the same as the diameter of the base opening 37 and the diameter of the support opening 35.

Also, the dimensions of the frame conductor 39 and the piezoelectric-side terminal 40 in the conductive pattern 19 are selectively determined appropriately. As shown in FIG. 4, the thickness of the frame conductor 39 is the same as the thickness of the conductive pattern 19 (including the wires 25, the front-side terminals 26, and the rear-side terminals 27), and the thickness of the piezoelectric-side terminal 40 (height of the piezoelectric-side terminal 40 in the up-down direction from the upper surface thereof except for the protruding portions 43 to the terminal exposed surfaces 44) is in a range of 2 to 10 μm, or preferably 3 to 7 μm.

The ratio of the thickness of the piezoelectric-side terminal 40 to the thickness of the frame conductor 39 is in a range of, e.g., 8/10 to 2/10, or preferably 6/10 to 3/10.

The thickness L1 of the projecting portion 51 (height of the projecting-portion side surface 52 in the up-down direction) is in a range of 2 to 8 μm, or preferably 3 to 7 μm. The thickness L2 of the covering base layer 54 (height of the covering-base side surface 55 in the up-down direction) is in a range of 1 to 5 μm, or preferably 2 to 4 μm.

The total sum L3 of the thickness L1 of the projecting portion 51 and the thickness L2 of the covering base layer 54 is in a range of 3 to 12 μm, or preferably 5 to 8 μm.

The ratio (=L2/L1) of the thickness L2 of the covering base layer 54 to the thickness L1 of the projecting portion 51 is in a range of, e.g., 1/8 to 5/2, or preferably 2/5 to 4/5.

Note that, when the total sum L3 is under the range shown above, it may be impossible to sufficiently increase the adhesive area between the piezoelectric-side terminal 40 and the conductive adhesive 46 (see FIG. 3) and sufficiently improve the adhesive force therebetween.

The height L4 of the stepped portion 42 in the up-down direction is in a range of, e.g., 1 to 5 µm, or preferably 2 to 4 µm.

The length W1 of each of the projecting portions 51 in the front-rear direction (length of each of the covering base layers 54 in the front-rear direction) is in a range of 5 to 50 µm, or preferably 10 to 30 µm. The distance W2 between the adjacent projecting portions 51 is in a range of 5 to 50 µm, or preferably 10 to 30 µm.

Note that the total sum W3 of the length W1 of each of the projecting portions 51 in the front-rear direction and the distance W2 between the adjacent projecting portions 51 in the front-rear direction is in a range of 10 to 100 µm, or preferably 20 to 60 µm.

The ratio (=W2/W1) of the distance W2 between the adjacent projecting portions 51 to the length W1 of the projecting portion 51 in the front-rear direction is in a range of, e.g., 50/5 to 20/20, or preferably 40/10 to 30/20.

The ratio (=S2/S1) of the area S2 of the terminal exposed surface 44 to the area S1 of the projecting-portion bottom surface 53 of the projecting portion 51 is in a range of, e.g., 10/1 to 10/5, or preferably 10/2 to 10/4.

As shown in FIGS. 6 and 7, the joint portion 41 extends between one widthwise end portion of the middle portion of the linear portion 20 in the front-rear direction and the other widthwise end portion of the pad portion 33.

The joint portion 41 is formed in a generally rectangular shape in plan view extending in the widthwise direction and having a width smaller than the outer diameter (length in the front-rear direction shorter than that) of the pad portion 33.

As shown in FIGS. 5 and 6, the joint portion 41 includes the insulating base layer 28, the power-source wire 25B formed on the insulating base layer 28, and the insulating cover layer 29 formed so as to cover the power-source wire 25B.

In the joint portion 41, as shown in FIG. 6, the insulating base layer 28 is formed in a shape corresponding to the outer shape of the joint portion 41. The insulating base layer 28 in the joint portion 41 is formed to be continued to the insulating base layer 28 in the linear portion 20 and to the insulating base layer 28 in the pad portion 33.

The power-source wire 25B in the joint portion 41 is formed so as to extend along the widthwise direction, and formed to be continued to the power-source wire 25B in the linear portion 20 and to the other widthwise end portion of the frame conductor 39 in the pad portion 33.

In the joint portion 41, the insulating cover layer 29 is formed in a pattern covering the upper surface and side surfaces of the power-source wire 25B and exposing the upper surfaces of the both end portions of the insulating base layer 28 in the front-rear direction.

Note that, in the suspension board with circuit 3, as shown in FIGS. 3 and 5, protective thin films 47 are formed on the respective surfaces of the individual terminals, which are specifically the front-side terminals 26 (see FIG. 1), the rear-side terminals 27 (see FIG. 1), the piezoelectric-side terminal 40, and the frame conductor 39.

In the pad portion 33, the protective thin films 47 are formed over the upper surface of the piezoelectric-side terminal 40 (including the protruding portions 43 and the connecting portion 45), the projecting-portion side surfaces 52 of the projecting portions 51, the stepped portion 42, and the terminal exposed surfaces 44.

The protective thin films 47 are formed of a metal material such as, e.g., nickel or gold. Preferably, the protective thin films 47 are formed of nickel. The thickness of the protective thin film 47 is in a range of, e.g., 0.05 to 0.1 µm.

Next, a producing method of the assembly 1 is described.

To produce the assembly 1, each of the suspension board with circuit 3, the support plate 2, and the piezoelectric elements 5 is prepared first.

Next, a method of preparing (producing) the suspension board with circuit 3 is described with reference to FIGS. 8 and 9.

In the method, as shown in FIG. 8(a), the metal supporting board 18 is prepared first.

Next, as shown in FIG. 8(b), the insulating base layer 28 and the covering base layers 54 are simultaneously formed on the upper surface (on one side in the thickness direction in the production process views of FIGS. 8 and 9, which similarly applies to the following) of the metal supporting board 18.

In each of the pad portions 33, the insulating base layer 28 is formed in a pattern corresponding to the piezoelectric-side terminals 40 and the frame conductors 39 which are subsequently formed on the upper surface of the metal supporting board 18, while the covering base layers 54 are formed in a pattern corresponding to the projecting portions 51 on the upper surface of the metal supporting board 18.

The covering base layers 54 are formed thinner than the insulating base layer. At this time, the thickness of the covering base layer 54 is in a range of, e.g., 10 to 50% of the thickness of the insulating base layer 28, specifically in a range of 1 to 5 µm.

Specifically, to form the insulating base layer 28 and the covering base layers 54, e.g., a varnish of a photosensitive insulating material is first applied to the upper surface of the metal supporting board 18 and dried to form a photosensitive base coating.

Next, the photosensitive base coating is subjected to exposure (gradation exposure) via a gradation exposure photomask not shown. The gradation exposure photomask includes light shielding portions, light semi-transmitting portions, and a light full transmitting portion in a pattern. The light full transmitting portion is caused to face the portion of the base coating in which the insulating base layer 28 is formed, the light semi-transmitting portions are caused to face the portions of the base coating in which the covering base layers 54 are formed, and the light shielding portions are caused to face the portions of the base coating in which neither the insulating base layer 28 nor the covering base layer 54 is formed.

Thereafter, the base coating subjected to the gradation exposure is developed, and cured by heating as necessary to form the insulating base layer 28 and the covering base layers 54.

Next, as shown in FIG. 8(c), the conductive layer 19 is formed over the upper surface of the insulating base layer 28 by an additive method or a subtractive method. Preferably, the conductive pattern 19 is formed by the additive method.

That is, as shown in FIG. 1, the conductive pattern 19 is formed over the upper surface of the insulating base layer 28 so as to be provided with the wires 25, and the front-side terminals 26, the rear-side terminals 27, and the piezoelectric-side terminals 40 which are continued thereto.

In each of the pad portions 33, as shown in FIG. 8(c), the conductive pattern 19 is formed by the method described above so as to cover the inner peripheral portion of the insulating base layer 28, the upper surface of the metal supporting board 18 exposed from the insulating base layer 28 and the covering base layers 54, and the upper surfaces of the covering base layers 54.

Specifically, in the pad portion 33, the conductive pattern 19 is formed to follow the upper surface of the metal supporting board 18 exposed from the insulating base layer 28 and the covering base layers 54 and have the same thickness throughout a plane direction.

However, at this stage, the upper surface of the piezoelectric-side terminal 40 of the conductive pattern 19 is formed with the protruding portions 43 corresponding to the covering base layers 54, but the lower surface thereof has not been formed with the projecting portions 51.

Thus, on the upper surface of the metal supporting board 18, the conductive pattern 19 is laminated.

Next, as shown in FIGS. 5 and 6, the insulating cover layer 29 is formed in the foregoing pattern covering the conductive pattern 19 so as to expose the upper surfaces of the front-side terminals 26, the rear-side terminals 27, and the piezoelectric-side terminals 40.

Specifically, to the entire upper surface of the metal supporting board 18 including the conductive pattern 19 and the insulating base layer 28, a varnish of a photosensitive insulating material is applied, dried, exposed to light, developed, and then cured by heating.

Next, as shown in FIG. 9(d), the metal supporting board 18 is trimmed and formed to be provided with the wiring portion 16, the front portion 15, the rear portion 17, and the support pads 34. For the trimming, e.g., an etching method such as, e.g., dry etching (e.g., plasma etching) or wet etching (e.g., chemical etching), drilling perforation, laser processing, or the like is used. Preferably, wet etching is used.

In each of the pad portions 33, the metal supporting board 18 is formed with the support pad 34 and also with the support opening 35.

Next, as shown in FIG. 9(e), the piezoelectric-side terminal 40 exposed from the support opening 35 is partly removed.

The piezoelectric-side terminal 40 is partly removed by, e.g., etching, or preferably wet etching using the covering base layers 54 as an etching resist.

In this manner, the piezoelectric-side terminal 40 is formed with the projecting portions 51, and the terminal exposed surfaces 44 are exposed from the base opening 37. That is, the piezoelectric-side terminal 40 is formed in a pattern.

By also removing the piezoelectric-side terminal 40 between the adjacent covering base layers 54, the covering-base side surfaces 55 of the covering base layers 54 are exposed, and the covering base layers 54 are formed so as to cover the projecting portions 51 from therebelow.

Thereafter, as shown in FIG. 9(f), the protective thin films 47 are formed on the surfaces of the front-side terminals 26 (see FIG. 1), the rear-side terminals 27 (see FIG. 1), and the piezoelectric-side terminals 40 by, e.g., plating, or preferably by electroless plating.

In this manner, the suspension board with circuit 3 is prepared (produced).

Next, as shown in FIGS. 1 and 2, the suspension board with circuit 3, the support plate 2, and the piezoelectric elements 5 are assembled.

First, the suspension board with circuit 3 is disposed on the upper surface of the support plate 2. Specifically, as shown in FIG. 1, the suspension board with circuit 3 is fixed to the support plate 2 by means of, e.g., welding, an adhesive, or the like such that the linear portion 20 of the wiring portion 16 traverses the widthwise middle portion of the plate opening 12, the bent portion 21 of the wiring portion 16 is disposed on the one widthwise end portion and front end portion of the rear plate portion 9, and the front portion 15 of the wiring portion 16 is disposed on the widthwise middle portion of the load beam portion 8 to extend in the front-rear direction of the load beam portion 8.

Thereafter, as shown in FIG. 3, each of the piezoelectric elements 5 is fixed to the support plate 2, while the piezoelectric terminal 48 of the piezoelectric element 5 is electrically connected to the piezoelectric-side terminal 40.

To fix the piezoelectric element 5 to the support plate 2, the adhesive layers 31 are disposed on the attachment regions 13 of the actuator plate portion 6 and, via the adhesive layers 31, the both end portions of the piezoelectric element 5 in the front-rear direction are attached to the attachment regions 13. As shown in FIG. 1, the piezoelectric elements 5 are disposed in the plate opening 12 and on the both widthwise outsides of the linear portion 20 of the suspension board with circuit 3 to be spaced apart therefrom.

Then, as shown in FIGS. 3 and 5, the piezoelectric-side terminal 40 of the suspension board with circuit 3 is electrically connected to the piezoelectric terminal 48 of the piezoelectric element 5 via the conductive adhesive 46. Specifically, between the piezoelectric-side terminal 40 and the piezoelectric terminal 48, the conductive adhesive 46 is interposed and, by heating the conductive adhesive 46, the piezoelectric-side terminal 40, and the piezoelectric terminal 48 to, e.g., a relatively low temperature (specifically in a range of 100 to 200° C.), the piezoelectric-side terminal 40 and the piezoelectric terminal 48 are bonded to each other. This provides electrical connection between the piezoelectric-side terminal 40 and the piezoelectric terminal 48.

The conductive adhesive 46 is a connection medium which exhibits an adhesive effect when heated at a relatively low temperature (in a range of, e.g., 100 to 200° C.). The connection medium is made of, e.g., a conductive paste such as a silver paste, a low-melting-point metal such as an eutectic alloy (tin-based alloy) such as, e.g., a tin-bismuth alloy or a tin-indium alloy, or the like. Preferably, the connection medium is formed of a conductive paste.

The piezoelectric-side terminal 40 is electrically connected to the piezoelectric terminal 48 of the piezoelectric element 5 via the conductive adhesive 46 and is also bonded to the piezoelectric terminal 48.

In addition, as shown in FIGS. 1 and 2, the slider 22 mounting the magnetic head (not shown) is mounted on the gimbal 23 to electrically connect the magnetic head (not shown) and the front-side terminals 26.

Moreover, the read/write board (not shown) is electrically connected to the external terminals 27A, and the power source (not shown) is electrically connected to the power-source-side terminals 27B.

Furthermore, the drive coil (not shown) is attached to the base plate portion 7.

In this manner, the assembly 1 is obtained. The obtained assembly 1 is mounted in the hard disk drive (not shown).

In the hard disk drive, the slider 22 of the assembly 1 circumferentially travels relative to a rotating hard disk in the form of a circular plate, while being floated over the surface of the hard disk with a minute gap being held therebetween. Meanwhile, the magnetic head (not shown) of the assembly 1 reads/writes information, while moving in the radial direction of the hard disk based on driving by the drive coil.

In addition, by the extension/contraction of the piezoelectric elements 5, the position of the magnetic head relative to the hard disk drive is accurately and finely adjusted.

That is, electricity is supplied from the power source (not shown) to each of the piezoelectric elements 5 via the power-source-side terminal 27B, the power-source wire 25B, and the piezoelectric-side terminal 40. The voltage of the electricity supplied to each of the piezoelectric elements 5 is controlled to control the extension/contraction of the piezoelectric element 5. The front end portion of the rear plate portion 9 and the rear end portion of the front plate portion 10 go farther away from and come closer to each other, while being flexibly supported on the flexible portion 11. Therefore, when a voltage for extension is applied to one of the piezoelectric elements 5 and a voltage for contraction is applied to the other piezoelectric element 5, the front plate portion 10 and the load beam portion 8 swing around the widthwise middle point of the front end portion of the rear plate portion 9 toward the other widthwise side. At the same time, the suspension board with circuit 3 and the slider 22 which are fixed to the load beam portion 8 swing toward the other widthwise side.

On the other hand, when the voltage for contraction is applied to the one piezoelectric element 5 and the voltage for extension is applied to the other piezoelectric element 5, the front plate portion 10 and the load beam portion 8 swing in a direction opposite to the direction described above.

In the suspension board with circuit 3, as shown in FIG. 3, each of the piezoelectric-side terminals 40 is formed with the projecting downward portions 51 and the covering base layers 54 covering the projecting-portion bottom surfaces 53 of the projecting portions 51.

As a result, due to the projecting portions 51 formed at the lower surface of the piezoelectric-side terminal 40 and the covering base layers 54 formed at the projecting-portion bottom surfaces 53 of the projecting portions 51 (i.e., by the area of the projecting-portion side surfaces 52 and the covering-base side surfaces 55), compared to the case where the entire lower surface of the piezoelectric-side terminal 40 is the terminal exposed surface 44, the area of the piezoelectric-side terminal 40 to be connected to the piezoelectric element 5 can be increased.

In particular, the lower surface of the piezoelectric-side terminal 40 is formed not only with the projecting portions 51, but also with the covering base layers 54 formed on the projecting-portion bottom surfaces 53 of the projecting portions 51. As a result, compared to the case where only the projecting portions 51 are formed, the area of the piezoelectric-side terminal 40 to be connected to the piezoelectric element 5 can be increased accordingly by the thicknesses of the covering base layers 54.

Consequently, the reliability of the connection between the piezoelectric element 5 and the piezoelectric-side terminal 40 can be improved.

In addition, the piezoelectric-side terminal 40 is connected to the piezoelectric terminal 48 via the conductive adhesive 46.

At this time, the piezoelectric-side terminal 40 to be connected to the piezoelectric element 5 is provided with a sufficient area. This can improve the adhesive force between the conductive adhesive 46 and the piezoelectric-side terminal 40.

Therefore, using the conductive adhesive 46, it is possible to reliably connect the piezoelectric-side terminal 40 and the piezoelectric element 5.

Also, from the base opening 37 of the insulating base layer 28, the lower surface of the piezoelectric-side terminal 40 defined by the base opening 37 is exposed.

This allows the insulating base layer 28 to suppress a short circuit between the portion (such as, e.g., the wires 25) of the conductive pattern 19 other than the piezoelectric-side terminals 40 and another member, and also allows the terminal exposed surfaces 44 and the projecting-portion side surfaces 52 of the piezoelectric-side terminal 40 exposed from the base opening 37 to be electrically connected to the piezoelectric elements 5.

In addition, the insulating base layer 28 and the covering base layers 54 are formed of the same insulating material such as a synthetic resin.

Therefore, it is possible to bring the covering base layers 54 into close contact with the projecting portions 51 using the adhesive force between the insulating base layer 28 and the conductive pattern 19.

When the conductive adhesive is used, since the insulating base layer 28 and the covering base layers 54 are formed of the insulating material (synthetic resin) or the like, an improvement in the adhesion to the conductive adhesive can also be achieved.

Note that, since the insulating base layer 28 and the covering base layers 54 can be simultaneously formed, the number of production steps and cost can be reduced.

Moreover, since the total sum L3 of the thickness L1 of the projecting portion 51 of the piezoelectric-side terminal 40 and the thickness L2 of the covering base layer 54 is the same as or larger than the thickness of the insulating base layer 28, the area of the piezoelectric-side terminal 40 to be connected to the piezoelectric element 5 can be further increased.

Therefore, it is possible to further improve the reliability of the connection between the piezoelectric element 5 and the piezoelectric-side terminal 40.

Furthermore, from the support openings 35 of the metal supporting board 18, the lower surfaces of the piezoelectric-side terminals 40 defined by the support openings 35 can be exposed.

Therefore, it is possible to reinforce the piezoelectric-side terminals 40 from therebelow with the metal supporting board 18, ensure the rigidity of the piezoelectric-side terminals 40, and also connect the piezoelectric-side terminals 40 exposed from the support openings 35 to the piezoelectric elements 5.

Also, from the cover openings 62 of the insulating cover layer 29, the upper surfaces of the piezoelectric-side terminals 40 defined by the cover openings 62 are exposed.

This allows the insulating cover layer 29 to suppress a short circuit between the portion (such as, e.g., the wires 25) of the conductive pattern 19 other than the piezoelectric-side terminals 40 and another member, and also allows the upper surfaces of the piezoelectric-side terminals 40 to be exposed from the cover openings 62. Therefore, the upper surfaces of the piezoelectric-side terminals 40 can also be used for electrical connection.

According to the producing method of the wired circuit board 3 shown in FIGS. 8 and 9, first, on the upper surface of the metal supporting board 18, the covering base layers 54 are laminated and, on the upper surface of the metal supporting board 18, the conductive pattern 19 is laminated so as to cover the covering base layers 54 and form the piezoelectric-side terminals 40. Then, the metal supporting board 18 is etched to expose the conductive pattern 19 and the covering-base bottom surfaces 56 of the covering base layers 54. Subsequently, using the covering base layers 54 as an etching resist, the piezoelectric-side terminals 40 are etched. In this manner, it is possible to form the piezoelectric-side terminals 40 each including the projecting portions 51 projecting downward from the terminal exposed surfaces 44, and the covering base layers 54 covering the projecting-portion bottom surfaces 53 of the projecting portions 51 into a pattern.

According to such a method, the piezoelectric-side terminals 40 can be etched using the covering base layers 54 as an etching resist. Accordingly, the covering base layers 54 and the projecting portions 51 can be formed more efficiently than in the case of forming the covering base layers 54 after forming the projecting portions 51.

As a result, it is possible to obtain the suspension board with circuit 3 which is excellent in the reliability of the connection with the piezoelectric elements 5.

Note that, since the insulating base layer 28 and the covering base layer 54 can be formed simultaneously, it is possible to efficiently form the insulating base layer 28 and the covering base layers 54 and simplify the production steps.

Figure 10:
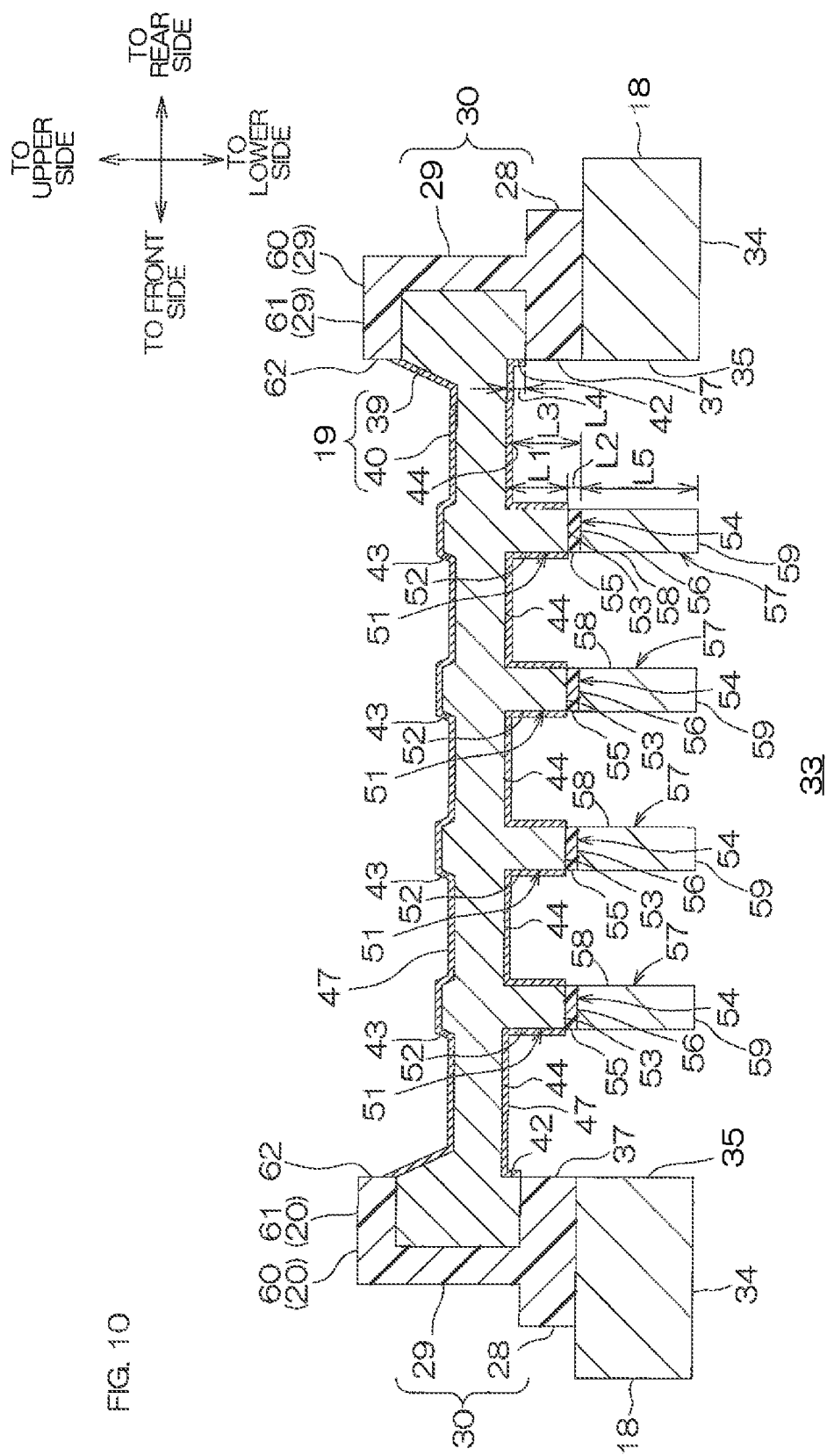
FIG. 10 shows a cross-sectional view of a pad portion of a suspension board with circuit as another embodiment of the wired circuit board of the present invention (a form in which support covering layers are formed under covering base layers)
Figure 11:
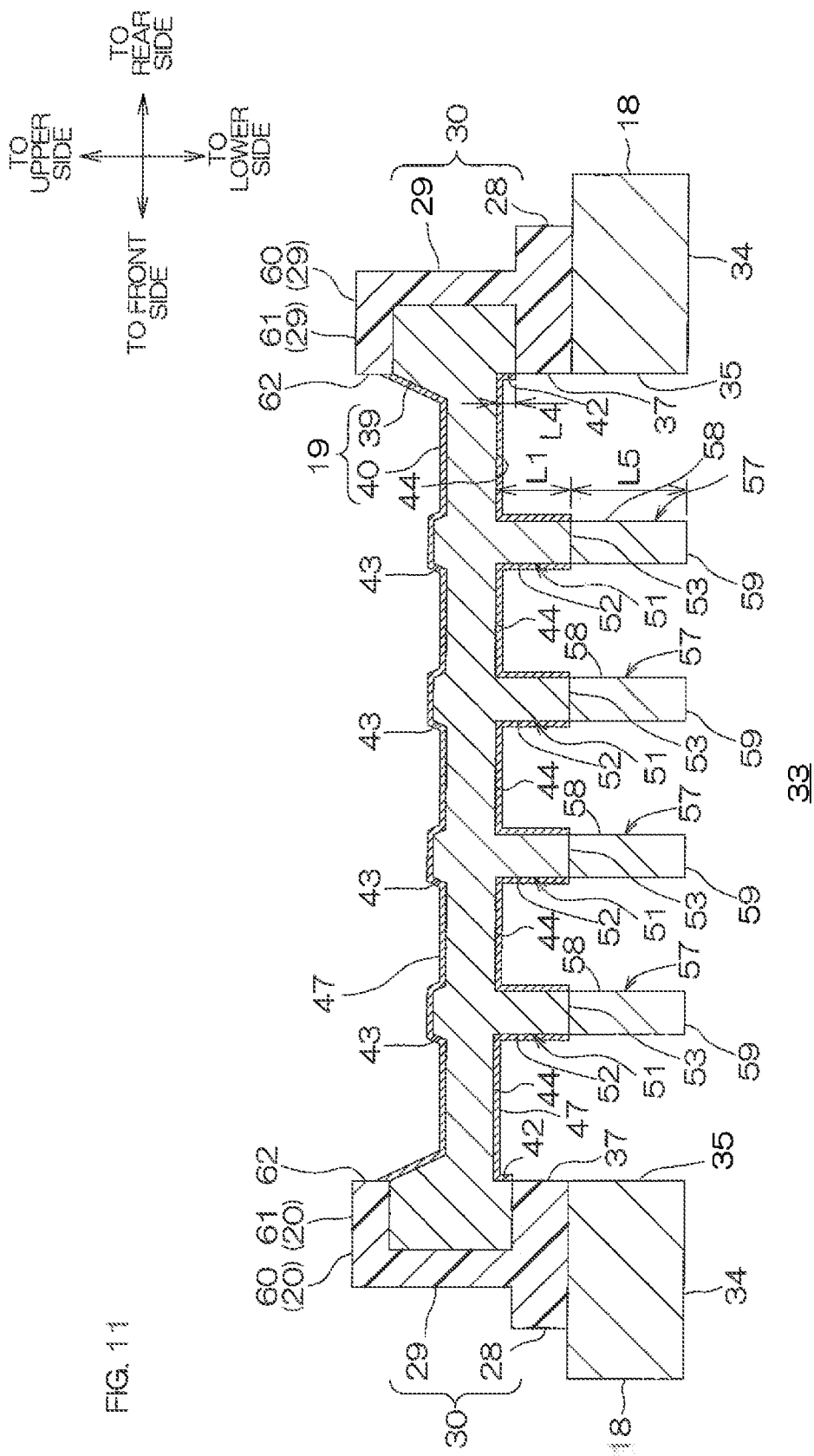
FIG. 11 shows a cross-sectional view of a pad portion of a suspension board with circuit as still another embodiment of the wired circuit board of the present invention (a form in which support covering layers are formed under projecting portions).

FIG. 10 shows a cross-sectional view of a pad portion of a suspension board with circuit as another embodiment of the wired circuit board of the present invention (a form in which support covering layers are formed under covering base layers). FIG. 11 shows a cross-sectional view of a pad portion of a suspension board with circuit as still another embodiment of the wired circuit board of the present invention (a form in which support covering layers are formed under projecting portions).

Note that the members corresponding to the individual components described above are designated by the same reference numerals in each of the subsequent drawings, and a detailed description thereof is omitted.

In the embodiment of FIG. 4, on the respective projecting-portion bottom surfaces 53 of the individual projecting portions 51, the covering base layers 54 are formed each as an example of the covering layer. However, as shown in FIG. 10, it is also possible to form support covering layers 57 each as an example of the covering layer and a second covering layer on the respective covering-base bottom surfaces 56 of the individual covering base layers 54.

The support covering layers 57 are formed of the same metal material as the metal material of the metal supporting board 18.

Note that the support covering layers 57 have the side surfaces thereof defined as support-covering side surfaces 58 and the lower surfaces thereof defined as support-covering bottom surfaces 59.

Each of the support covering layers 57 is formed to have the same shape as that of each of the projecting portions 51 and the covering base layers 54 when projected in the up-down direction. The support covering layer 57 is also formed such that the upper surface thereof comes in contact with the covering-base bottom surface 56 of the covering base layer 54 and the lower surface thereof is at the same height as that of the lower surface of the support pad 34. The both widthwise end portions of the support covering layer 57 are continued to the support pad 34.

The thickness L5 of the support covering layer 57 is in a range of 15 to 50 μm, or preferably 15 to 20 μm.

It may also be possible to further etch only the support covering layers 57. In that case, the thickness L5 of the support covering layer 57 is in a range of 3 to 20 μm, or preferably 5 to 18 μm.

The ratio (=L5/L3) of the thickness L5 of the support covering layer 57 to the total sum L3 of the thickness L1 of the projecting portion 51 and the thickness L2 of the covering base layer 54 is in a range of, e.g., 20/8 to 15/5, or preferably 18/8 to 18/5.

In the producing method of the embodiment of FIG. 4, in each of the pad portions 33, the metal supporting board 18 is etched to form the support pad 34 and also form the support opening 35 (see FIG. 9(*d*)). By contrast, in the producing method of the embodiment of FIG. 10, in each of the pad portions 33, the metal supporting board 18 is etched to form the support pad 34 and the support opening 35, and also form the support covering layers 57 inside the support opening 35.

Then, in the producing method of the embodiment of FIG. 4, using the covering base layers 54 as an etching resist, the piezoelectric-side terminal 40 is etched to be formed with the projecting portions 51 (see FIG. 9(*e*)). By contrast, in the producing method of the embodiment of FIG. 10, using the support covering layers 57 as an etching resist, the piezoelectric-side terminal 40 is etched to be formed with the projecting portions 51.

In the embodiment of FIG. 10, the same function/effect as in the embodiment of FIG. 4 is achieved. In addition, at the lower surface of the piezoelectric-side terminal 40, not only the projecting portions 51 and the covering base layers 54 formed on the projecting-portion bottom surfaces 53 of the projecting portions 51 are formed, but also the support covering layers 57 are further formed on the covering-base bottom surfaces 56 of the covering base layer 54. This can further increase the area of the piezoelectric-side terminal 40 to be connected to the piezoelectric element 5.

As a result, it is possible to further improve the reliability of the connection between the piezoelectric element 5 and the piezoelectric-side terminal 40.

In addition, using the adhesive force between the metal supporting board 18 and the insulating base layer 28, the support covering layers 57 can be brought into close contact with the covering base layers 54.

Furthermore, since the metal supporting board 18 and the support covering layers 57 are formed of the same material, the metal supporting board 18 and the support covering layers 57 can be formed simultaneously.

Therefore, it is possible to reduce the number of the production steps and cost.

According to the producing method of the embodiment shown in FIG. 10, first, on the upper surface of the metal supporting board 18, the covering base layers 54 are laminated and, on the upper surface of the metal supporting board 18, the conductive pattern 19 is laminated so as to cover the covering base layers 54 and form the piezoelectric-side terminals 40. Then, the metal supporting board 18 is etched to form the support openings 35 and the support covering layers 57 to expose the lower surfaces of the piezoelectric-side terminals 40. Subsequently, using the support covering layers 57 as an etching resist, the piezoelectric-side terminals 40 are etched. In this manner, it is possible to form the piezoelectric-side terminals 40 each including the projecting portions 51 projecting downward from the terminal exposed surfaces 44 of the piezoelectric-side terminal 40, the covering base layers 54 covering the projecting-portion bottom surfaces 53 of the projecting portions 51, and the support covering layers 57 covering the lower end portions of the covering base layers 54 into a pattern.

According to such a method, the piezoelectric-side terminals 40 can be etched using the support covering layers 57 as an etching resist. Accordingly, the covering base layers 54, the support covering layers 57, and the projecting portions 51 can be formed more efficiently than in the case of forming the covering base layers 54 and the support covering layers 57 after forming the projecting portions 51.

As a result, at the lower surfaces of the piezoelectric-side terminals 40, not only the projecting portions 51 and the covering base layers 54 formed on the projecting-portion bottom surfaces 53 of the projecting portions 51 can be formed, but also the support covering layers 57 can be further formed on the covering-base bottom surfaces 56 of the covering base layer 54. This can further increase the area of the piezoelectric-side terminal 40 to be connected to the piezoelectric element 5 due to the support-covering side surfaces 58 of the support covering layers 57.

Accordingly, it is possible to easily obtain the suspension board with circuit 3 which is excellent in the reliability of connection with the piezoelectric elements 5 at low cost.

In the embodiment of FIG. 10, on the projecting-portion bottom surfaces 53 of the projecting portions 51, the covering base layers 54 and the support covering layers 57 are formed each as an example of the covering layer. However, as shown in FIG. 11, it is also possible to form only the support covering layers 57.

In this case, each of the projecting-portion bottom surfaces 53 of the projecting portions 51 is formed at the same height as that of the lower surface of the insulating base layer 28.

In addition, each of the support covering layers 57 is formed such that the upper surface thereof comes in contact with the projecting-portion bottom surface 53 of the projecting portion 51 and the lower surface thereof is at the same height as that of the lower surface of the support pad 34.

The thickness L1 of the projecting portion 51 is in a range of 2 to 8 μm, or preferably 4 to 6 μm.

The thickness L5 of the support covering layer 57 is the same as in the embodiment of FIG. 10.

The ratio (=L5/L1) of the thickness L5 of the support covering layer 57 to the thickness L1 of the projecting portion 51 is in a range of, e.g., 20/6 to 15/3, or preferably 18/6 to 18/3.

In the producing method of the embodiment of FIG. 10, in each of the pad portions 33, the insulating base layer 28 is formed on the upper surface of the metal supporting board 18 into the pattern corresponding to the piezoelectric-side terminal 40 and the frame conductor 39, while the covering base layers 54 are formed on the upper surface of the metal supporting board 18 into the pattern corresponding to the projecting portions 51. By contrast, in the embodiment of FIG. 11, only the insulating base layer 28 is formed.

Then, in the same manner as in the producing method of the embodiment of FIG. 10, the metal supporting board 18 is etched to form the support pad 34 and the support opening 35, while the support covering layers 57 are formed inside the support opening 35.

Also, in the same manner as in the producing method of the embodiment of FIG. 10, using the support covering layers 57 as an etching resist, the piezoelectric-side terminal 40 is etched to be formed with the projecting portions 51.

In the embodiment of FIG. 11, the same function/effect as in the embodiment of FIG. 10 is achieved. In addition, since the support covering layers 57 covering the projecting-portion bottom surfaces 53 of the projecting portions 51 are formed of the same material as that of the metal supporting board 18, the support covering layers 57 can be electrically connected to the piezoelectric element 5.

As a result, compared to the case where the support covering layers 57 are formed of an insulating material, the area of the piezoelectric-side terminal 40 to be electrically connected to the piezoelectric element 5 can be increased.

Additionally, according to the producing method of the embodiment shown in FIG. 11, first, on the upper surface of the metal supporting board 18, the conductive pattern 19 is laminated so as to form the piezoelectric-side terminals 40. Then, the metal supporting board 18 is etched to form the support openings 35 and the support covering layers 57 to expose the lower surfaces of the piezoelectric-side terminals 40. Subsequently, using the support covering layers 57 as an etching resist, the piezoelectric-side terminals 40 are etched. In this manner, it is possible to form the piezoelectric-side terminals 40 each including the projecting portions 51 projecting downward from the terminal exposed surfaces 44 of the piezoelectric-side terminals 40 and the support covering layers 57 covering the projecting-portion bottom surfaces 53 of the projecting portions 51 into a pattern.

According to such a method, the piezoelectric-side terminals 40 can be etched using the support covering layers 57. Therefore, the support covering layers 57 and the projecting portions 51 can be formed more efficiently than in the case of forming the support covering layers 57 after forming the projecting portions 51.

As a result, the projecting-portion bottom surfaces 53 of the projecting portions 51 can be covered with the support covering layers 57 formed of the same metal material as that of the metal supporting board 18. This allows the piezoelectric elements 51 to be electrically connected to the support covering layers 57 and allows the support covering layers 57 to be electrically connected to the piezoelectric elements 5.

Therefore, it is possible to easily obtain the suspension board with circuit 3 which is excellent in the reliability of connection with the piezoelectric elements 5 at low cost.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A wired circuit board, comprising: a wire; and a-an electronic element-side terminal formed continuously to the wire and configured to be electrically connected to an electronic element at one surface thereof in a thickness direction of the wired circuit board, wherein the electronic element-side terminal includes a plate-shaped portion and, at the one surface of the plate-shaped portion in the thickness direction, a plurality of projecting portions projecting away from the plate-shaped portion in the thickness direction, and a plurality of covering layer-layers respectively covering one end portion of the projecting portions in the thickness direction; wherein the wire and the electronic element-side terminal are provided integrally in a conductive pattern, the wired circuit board further comprising: an insulating base layer formed on the one side of the conductive pattern in the thickness direction, wherein the insulating base layer is formed with a base opening exposing the one surface of the electronic element-side terminal in the thickness direction; wherein each of the covering layers includes a first covering layer formed of the same material as that of the insulating base layer.

2. A wired circuit board according to claim 1, wherein the electronic element-side terminal is to be used for being connected to the electronic element via a conductive adhesive.

3. A wired circuit board according to claim 1, wherein a total sum of a thickness of each of the projecting portions of the electronic element-side terminal and a thickness of the first covering layer thereof is the same as or larger than a thickness of the insulating base layer.

4. A wired circuit board according to claim 1, further comprising: a metal supporting board formed on the one side of the insulating base layer in the thickness direction, wherein the metal supporting board is formed with a support opening exposing the one surface of the electronic element-side terminal in the thickness direction.

5. A wired circuit board according to claim 1, further comprising: a metal supporting board formed on the one side of the insulating base layer in the thickness direction, wherein the metal supporting board is formed with a support opening exposing the one surface of the electronic element-side terminal in the thickness direction.

6. A wired circuit board according to claim 1, further comprising: an insulating cover layer formed on the other side of the conductive pattern in the thickness direction, wherein the insulating cover layer is formed with a cover opening exposing the other surface of the electronic element-side terminal in the thickness direction.

7. A wired circuit board according to claim 1, wherein the plate-shaped portion of the electronic element-side terminal is formed in a generally circular shape in a plan view, and wherein the plurality of projecting portions project downward from a lower surface of the plate-shaped portion.

8. A wired circuit board according to claim 4, wherein the covering layer includes a second covering layer formed of the same material as that of the metal supporting board on one end portion of the first covering layer in the thickness direction.

9. A wired circuit board according to claim 7, wherein the plurality of projecting portions are spaced apart from each other and form a striped pattern in a bottom view.

\* \* \* \* \*